US012776794B2

(12) United States Patent
Takenaka

(10) Patent No.: US 12,776,794 B2
(45) Date of Patent: Oct. 27, 2026

(54) RADIO FREQUENCY CIRCUIT

(71) Applicant: Murata Manufacturing Co., Ltd., Nagaokakyo (JP)

(72) Inventor: Isao Takenaka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 137 days.

(21) Appl. No.: 18/912,629

(22) Filed: Oct. 11, 2024

(65) Prior Publication Data

US 2025/0038774 A1 Jan. 30, 2025

Related U.S. Application Data

(63) Continuation of application No. PCT/JP2023/009104, filed on Mar. 9, 2023.

(30) Foreign Application Priority Data

Apr. 12, 2022 (JP) ................................ 2022-065892

(51) Int. Cl.
*H03H 7/01* (2006.01)
*H03H 7/38* (2006.01)
*H03H 9/64* (2006.01)
*H03H 9/68* (2006.01)
*H04B 1/04* (2006.01)
(Continued)

(52) U.S. Cl.
CPC ................ *H04B 1/04* (2013.01); *H03H 9/64* (2013.01); *H04B 1/1018* (2013.01); *H04B 2001/0408* (2013.01)

(58) Field of Classification Search
None
See application file for complete search history.

(56) References Cited

U.S. PATENT DOCUMENTS

2019/0013790 A1 1/2019 Ayranci et al.
2019/0165752 A1* 5/2019 Ta ............................ H03F 1/56
2020/0021274 A1* 1/2020 Wagner ................. H03H 9/542
(Continued)

FOREIGN PATENT DOCUMENTS

CN 216565137 U * 5/2022
JP 2001-339169 A 12/2001
(Continued)

OTHER PUBLICATIONS

International Search Report and Written Opinion mailed on Apr. 25, 2023, received for PCT Application PCT/JP2023/009104, filed on Mar. 9, 2023, 9 pages including English Translation.

*Primary Examiner* — Mohammed Rachedine
(74) *Attorney, Agent, or Firm* — XSENSUS LLP

(57) ABSTRACT

A radio frequency circuit includes an antenna connection terminal, an acoustic wave filter, a power amplifier connected to the acoustic wave filter, a temperature sensor that measures the temperature of either one or both of the acoustic wave filter and the power amplifier, a first variable inductor circuit that includes an inductor disposed in series between the acoustic wave filter and the antenna connection terminal and that has a variable inductance value, and a second variable inductor circuit that includes an inductor connected between the ground and a first path connecting the acoustic wave filter to the antenna connection terminal and that has a variable inductance value.

20 Claims, 11 Drawing Sheets

(51) Int. Cl.
*H04B 1/10* (2006.01)
*H04B 17/18* (2015.01)

(56) References Cited

U.S. PATENT DOCUMENTS

| | | | | |
|---|---|---|---|---|
| 2020/0127643 A1* | 4/2020 | Takamine | ............ | H03H 9/6483 |
| 2020/0204159 A1* | 6/2020 | Onodera | .............. | H03H 9/0514 |
| 2020/0244250 A1* | 7/2020 | Tomita | ..................... | H03H 9/64 |
| 2021/0044279 A1* | 2/2021 | Kim | ......................... | H01Q 1/50 |
| 2023/0083695 A1* | 3/2023 | Blamon | .................... | H03F 1/56<br>455/127.1 |

FOREIGN PATENT DOCUMENTS

| | | | | | |
|---|---|---|---|---|---|
| JP | 2011-234155 | A | | 11/2011 | |
| JP | 2014-143584 | A | | 8/2014 | |
| JP | 2022-002364 | A | | 1/2022 | |
| KR | 20210052243 | A | * | 5/2021 | ............... H04B 1/18 |
| KR | 20210066893 | A | * | 6/2021 | ............... H04B 1/10 |
| KR | 102312057 | B1 | * | 10/2021 | ....... H03H 19/14544 |
| KR | 102441262 | B1 | * | 9/2022 | ........... H04B 1/0057 |
| WO | 2015/002127 | A1 | | 1/2015 | |

* cited by examiner

RADIO FREQUENCY CIRCUIT

CROSS-REFERENCE TO RELATED APPLICATIONS

The present application is a continuation application of PCT International Application No. PCT/JP2023/009104 filed on Mar. 9, 2023, designating the United States of America, which is based on and claims priority to Japanese patent application JP 2022-065892, filed Apr. 12, 2022. The entire disclosures of the above-identified applications, including the specifications, the drawings, and the claims are incorporated herein by reference in their entirety.

BACKGROUND

A transmitter (radio frequency circuit) may include a power amplifying circuit, a temperature sensor, a variable load, and a control unit that adjusts characteristics of the variable load on the basis of temperature information of the power amplifying circuit which is measured by the temperature sensor.

SUMMARY

A radio frequency circuit according to an aspect of the present disclosure includes an antenna connection terminal; a first acoustic wave filter; a power amplifier connected to the first acoustic wave filter; a temperature sensor that measures a temperature of either one or both of the first acoustic wave filter and the power amplifier; a first variable inductor circuit that includes a first inductor disposed in series between the first acoustic wave filter and the antenna connection terminal, and that has a variable inductance value; and a second variable inductor circuit that includes a second inductor connected between the ground and a first path connecting the first acoustic wave filter to the antenna connection terminal, and that has a variable inductance value.

A method according to an aspect of the present disclosure includes measuring a temperature of either one or both of a first acoustic wave filter and a power amplifier; detecting the temperature being higher than a threshold temperature; and in response to detecting that the temperatures is higher than the threshold temperature: increasing an inductance value of a first variable inductor circuit, the first variable inductor circuit being connected to the first acoustic wave filter and the power amplifier, and increasing an inductance value of a second variable inductor circuit, the second variable inductor circuit being placed between a ground and a first path connecting the first acoustic wave filter to an antenna connection terminal.

A radio frequency circuit according to an aspect of the present disclosure includes an antenna connection terminal; a first acoustic wave filter; a power amplifier connected to the first acoustic wave filter; a first variable inductor circuit that includes a first inductor disposed in series between the first acoustic wave filter and the antenna connection terminal, and that has a variable inductance value; and a second variable inductor circuit that includes a second inductor connected between a ground and a first path connecting the first acoustic wave filter to the antenna connection terminal, and that has a variable inductance value. The first variable inductor circuit has a first variable capacitor, the second variable inductor circuit has a second variable capacitor, the first acoustic wave filter includes one or more surface acoustic wave resonators having an IDT (InterDigital Transducer) electrode, and either one or both of the first variable capacitor and the second variable capacitor include the IDT electrode.

DESCRIPTION OF EXEMPLARY EMBODIMENTS

Figure 1:
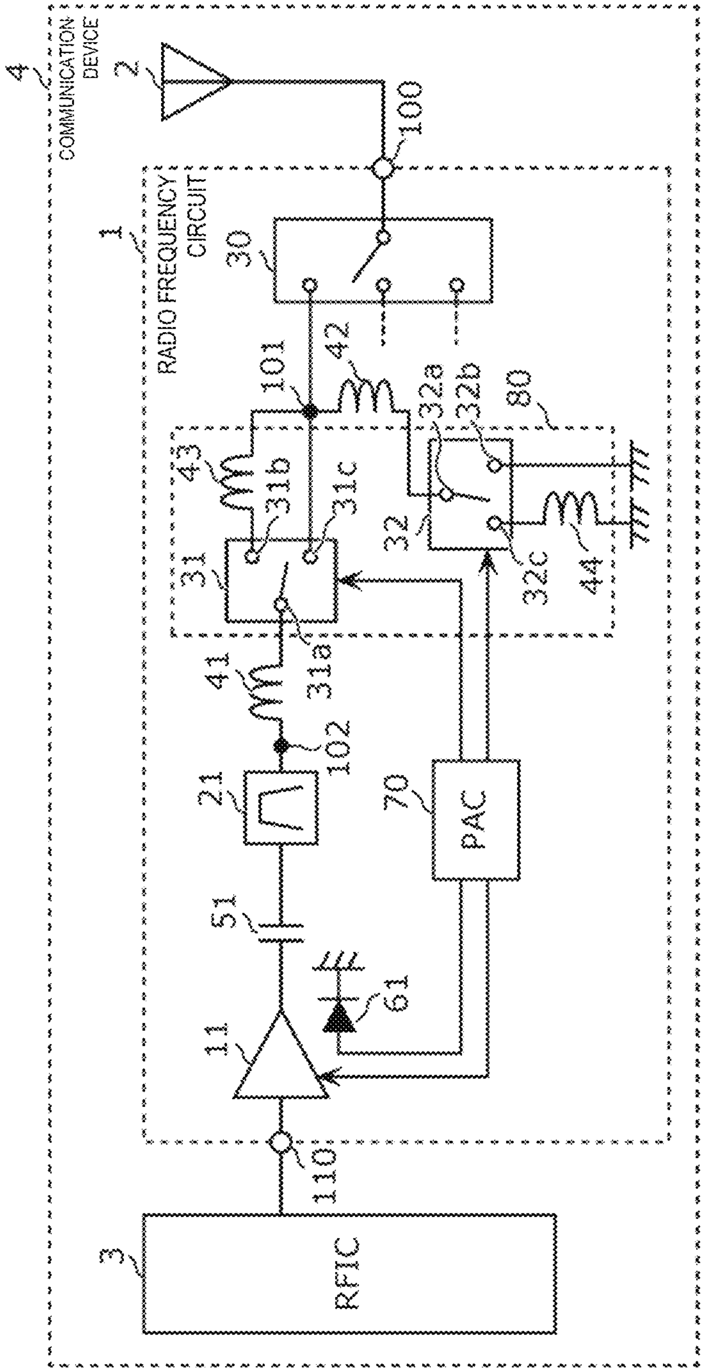
FIG. 1 is a diagram illustrating the circuit configuration of a radio frequency circuit and a communication device according to an exemplary embodiment.

Radio frequency circuits included in cellular phones have faced an extreme demand for high output. This leads to a concern that heat generated by the radio frequency circuits due to high output causes degradation of the signal transmission characteristics of their power amplifiers and filters. The radio frequency circuit may have difficulties in maintaining high output of the radio frequency circuit at high temperatures.

The present disclosure provides a radio frequency circuit which is capable of maintaining high output even at high temperatures.

Exemplary embodiments of the present disclosure will be described below in detail. Each exemplary embodiment described below is a comprehensive or concrete example. The numeral values, the shapes, the materials, the components, the layout and the connection form of components, and the like described in the embodiments described below are exemplary and are not intended to limit the present disclosure.

Among components in the examples and modified examples below, components that are not described in independent claims are described as optional components. The sizes or the ratios in size of the components illustrated in the drawings are not necessarily strict. In the figures, substantially similar configurations are designated with identical reference numerals. Repeated description may be avoided or simplified.

In the description below, terms indicating a relationship between components, such as parallel and perpendicular, terms indicating shapes of components, such as rectangular, and terms indicating numerical ranges are not restricted to exact values, but include substantially equivalent ranges, for example, having errors in the order of a few percent.

In the figures described below, an x axis and a y axis are orthogonal to each other in a plane parallel to a principal surface of a substrate. Specifically, when the substrate is rectangular in a plan view, the x axis is parallel to a first side of the substrate and the y axis is parallel to a second side orthogonal to the first side of the substrate. In addition, a z axis is perpendicular to the principal surface of the substrate. The positive direction of the z axis indicates the upward direction and its negative direction indicates the downward direction.

In addition, in the description below, when A, B, and C are included in a substrate, "in a plan view of the substrate (or a principal surface of the substrate), C is disposed between A and B" means that, in a plan view of the substrate, at least one of line segments which connect any point in A to any point in B passes through the area of C. A plan view of the substrate means that the substrate and a circuit device included in the substrate are viewed by being subjected to orthogonal projection to a plane parallel to a principal surface of the substrate.

In the description below, "A is disposed on a first principal surface of a substrate" means, not only that A is mounted directly on the first principal surface, but also that, between a space on the first principal surface side and a space on the second principal surface side which are separated by the substrate, A is disposed in the space on the first principal surface side. That is, it encompasses the state in which A is mounted on the first principal surface, for example, with other circuit devices and electrodes interposed in between.

In the present disclosure, "to be connected" means, not only the case of direct connection using a connection terminal and/or a wiring conductor, but also the case of electrical connection via other circuit devices. "To be connected between A and B" means connection to A and B on a path connecting A to B.

In the present disclosure, a "path" means a transmission line formed, for example, of wiring through which radio frequency signals are propagated, an electrode which is directly connected to the wiring, and a terminal connected directly to the wiring or the electrode.

In the present disclosure, "component A is disposed in series to path B" means that both the signal input end and the signal output end of component A are connected either to wiring, an electrode, or a terminal included in path B. In addition, in the present disclosure, "component A is disposed in series between B and C" means that the signal input end of component A is connected to wiring, an electrode, or a terminal included in B, and that the signal output end of component A is connected to wiring, an electrode, or a terminal included in C.

EXEMPLARY EMBODIMENT

[1. The Circuit Configuration of a Radio Frequency Circuit 1 and a Communication Device 4]

FIG. 1 is a diagram illustrating the circuit configuration of a radio frequency circuit 1 and a communication device 4 according to an exemplary embodiment. As illustrated in FIG. 1, the communication device 4 includes the radio frequency circuit 1, an antenna 2, and an RF-signal processing circuit (RFIC) 3.

The RFIC 3 is an RF-signal processing circuit which processes radio frequency signals received/transmitted by the antenna 2. Specifically, the RFIC 3 performs signal processing, for example, through down-converting on receive signals received through a receive path of the radio frequency circuit 1, and outputs, to a baseband-signal processing circuit (BBIC), receive signals generated through the signal processing. In addition, the RFIC 3 performs signal processing, for example, through upconverting on transmit signals received from the BBIC, and outputs, to a transmit path of the radio frequency circuit 1, transmit signals generated through the signal processing.

The RFIC 3 also has a function as a control unit which controls connections of switches 30, 31, and 32, which are included in the radio frequency circuit 1, on the basis of a communication band (frequency band) which is used. Specifically, the RFIC 3 switches connections of the switches 30 to 32, which are included in the radio frequency circuit 1, through control signals. Specifically, the RFIC 3 outputs, to a PA (Power Amplifier) control circuit 70, digital control signals for controlling the switches 30 to 32. The PA control circuit 70 of the radio frequency circuit 1 outputs control signals to the switches 30 to 32 on the basis of the digital control signals, which are received from the RFIC 3, to control connections and non-connections of the switches 30 to 32. Connection and non-connection of the switch 30 are not necessarily controlled by the PA control circuit 70 and may be controlled by another control circuit.

The RFIC 3 also has a function as a control unit which controls the gain of a power amplifier 11, which is included in the radio frequency circuit 1, and a power supply voltage and a bias voltage which are supplied to the power amplifier 11. Specifically, the RFIC 3 outputs a digital control signal to the radio frequency circuit 1. The PA control circuit 70 outputs, to the power amplifier 11, a control signal, the power supply voltage, and the bias voltage on the basis of the received digital control signal to adjust the gain of the power amplifier 11. The control unit may be provided outside the RFIC 3, and, for example, may be included in the BBIC.

The antenna 2, which is connected to an antenna connection terminal 100 of the radio frequency circuit 1, radiates radio frequency signals which are output from the radio frequency circuit 1, and receives radio frequency signals from the outside for output to the radio frequency circuit 1.

In the communication device 4 according to the present exemplary embodiment, the antenna 2 is not a necessary component.

The circuit configuration of the radio frequency circuit 1 will be described.

As illustrated in FIG. 1, the radio frequency circuit 1 includes the antenna connection terminal 100, an acoustic wave filter 21, the power amplifier 11, a temperature sensor 61, inductors 41, 42, 43, and 44, the switches 30, 31, and 32, the PA control circuit 70, a capacitor 51, and a transmission input terminal 110.

The antenna connection terminal 100 is connected to the antenna 2. The transmission input terminal 110 is connected to the RFIC 3.

The acoustic wave filter 21, which is an exemplary first acoustic wave filter, has one or more acoustic wave resonators. The acoustic wave filter 21 is connected, at its input end, to the output end of the power amplifier 11 through the capacitor 51, and is connected, at its output end, to a connection terminal 102. The acoustic wave filter 21 has a passband including a first transmit band. The first transmit band includes, as a passband, the uplink operating band of an FDD (Frequency Division Duplex) band or a TDD (Time Division Duplex) band.

Each acoustic wave resonator is a surface acoustic wave resonator or a bulk acoustic wave resonator. The surface acoustic wave resonator has an IDT (InterDigital Transducer) electrode formed on a piezoelectric substrate. The IDT electrode is constituted by a pair of comb-like electrodes which are opposite each other, and surface acoustic waves are excited for resonance between the pair of comb-like electrodes. The bulk acoustic wave resonator has a multilayer structure, for example, of a lower electrode, a piezoelectric layer, and an upper electrode which are laminated in this order, and bulk acoustic waves are excited for resonance between the lower electrode and the upper electrode.

The resonant frequency and the anti-resonant frequency of the acoustic wave resonator change due to a temperature change. This causes the passband and the attenuation band of the acoustic wave filter 21 to be frequency-shifted due to the temperature change and causes the input/output impedance to change.

An FDD band and a TDD band include frequency bands defined in advance by a standardization organization or the like (for example, 3GPP® (3rd Generation Partnership Project) or IEEE (Institute of Electrical and Electronics Engineers)) for communication systems constructed by using radio access technology (RAT). In the present exemplary embodiment, examples of a communication system may include, but are not limited to, a 4G (4th Generation)-LTE (Long Term Evolution) system, a 5G (5th Generation)-NR (New Radio) system, and a WLAN (Wireless Local Area Network) system.

As an FDD band, for example, Band B1 (uplink operating band: 1920 MHz to 1980 MHz, downlink operating band: 2110 MHz to 2170 MHz) or Band B3 (uplink operating band: 1710 MHz to 1785 MHz, downlink operating band: 1805 MHz to 1880 MHz) is used. As a TDD band, for example, Band B40 (2300 MHz to 2400 MHz) or Band B41 (2496 MHz to 2690 MHz) is used.

An uplink operating band means a frequency range, which is specified for uplink, in the band described above. A downlink operating band means a frequency range, which is specified for downlink, in the band described above.

The power amplifier 11 is capable of amplifying radio frequency signals in the first transmit band. The power amplifier 11 is connected, at its input end, to the transmission input terminal 110, and is connected, at its output end, to the input end of the acoustic wave filter 21 through the capacitor 51.

The power amplifier 11 is compatible with Power Class 2 and a power class whose maximum transmit power is higher than that of Power Class 2.

This enables the radio frequency circuit 1 to transmit high-power (Power Class 2 or higher) class transmit signals.

Power class refers to classifications of output power of a UE (User Equipment) which is defined, for example, by using its maximum output power. The lower the value of a power class is, the higher the allowable output power is. For example, in 3GPP®, the allowable maximum output power for Power Class 1 is 31 dBm; for Power Class 1.5, 29 dBm; for Power Class 2, 26 dBm; for Power Class 3, 23 dBm.

The maximum output power of a UE is defined by using its output power at the antenna end of the UE. The maximum output power of a UE is measured, for example, by using a method defined by 3GPP® or the like. For example, in FIG. 1, the radiant power at the antenna 2 is measured. Thus, the maximum output power is measured. Instead of measurement of the radiant power, a terminal may be provided near the antenna 2, and a measuring device (for example, a spectrum analyzer) may be connected to the terminal. Thus, the output power at the antenna 2 may be measured.

The temperature sensor 61 has a sensing part disposed near the acoustic wave filter 21 or the power amplifier 11, and measures the temperature of the acoustic wave filter 21 or the power amplifier 11. The temperature sensor 61 is, for example, a diode. The temperature sensor 61 may be disposed near the acoustic wave filter 21 and the power amplifier 11, and may measure the temperature of the acoustic wave filter 21 and the power amplifier 11.

The switch 30, which is an exemplary third switch, has a common terminal and multiple selection terminals, and switches between connection and non-connection between the common terminal and the selection terminals. The common terminal of the switch 30 is connected to the antenna connection terminal 100. One of the selection terminals is connected to a connection terminal 101.

The switch 31, which is an exemplary first switch, has a common terminal 31*a* (first common terminal), a terminal 31*b* (first terminal), and a terminal 31*c* (second terminal). The switch 31 switches between connection and non-connection between the common terminal 31*a* and the terminal 31*b*, and switches between connection and non-connection between the common terminal 31*a* and the terminal 31*c*.

The switch 32, which is an exemplary second switch, has a common terminal 32*a* (second common terminal), a terminal 32*b* (third terminal), and a terminal 32*c* (fourth terminal). The switch 32 switches between connection and non-connection between the common terminal 32*a* and the terminal 32*b*, and switches between connection and non-connection between the common terminal 32*a* and the terminal 32*c*.

The inductor 41, which is an exemplary first inductor, is disposed in series between the acoustic wave filter 21 and the antenna connection terminal 100. Specifically, the inductor 41 is connected, at its first end, to the connection terminal 102, and is connected, at its second end, to the common terminal 31*a*.

The inductor 43, which is an exemplary third inductor, is connected, at its first end, to the connection terminal 101, and is connected, at its second end, to the terminal 31*b*.

The terminal 31*c* is connected to the connection terminal 101.

The connection terminals 101 and 102, which are exemplary first and second connection terminals, respectively, are terminals disposed on a first path connecting the acoustic wave filter 21 to the antenna connection terminal 100.

The inductor 42, which is an exemplary second inductor, is connected between the first path and the ground. Specifically, the inductor 42 is connected, at its first end, to the connection terminal 101, and is connected, at its second end, to the common terminal 32*a*.

The inductor 44, which is an exemplary fourth inductor, is connected, at its first end, to the ground, and is connected, at its second end, to the terminal 32*c*.

The terminal 32*b* is connected to the ground.

In the connection configuration, the switch 31, the inductors 41 and 43, and the connection terminals 101 and 102 form a first variable inductor circuit, whose inductance value is made variable by switching the switch 31. The inductance value of the inductor 41 is represented by L41, and the inductance value of the inductor 43 is represented by L43. When the common terminal 31*a* is connected (or is not connected) to the terminal 31*b* and when the common terminal 31*a* is connected to the terminal 31*c*, the inductance value of the first variable inductor circuit will be L41. In contrast, when the common terminal 31*a* is connected to the terminal 31*b* and when the common terminal 31*a* is not connected to the terminal 31*c*, the inductance value of the first variable inductor circuit will be (L41+L43).

In the connection configuration, the switch 32 and the inductors 42 and 44 form a second variable inductor circuit, whose inductance value is made variable by switching the switch 32. The inductance value of the inductor 42 is represented by L42, and the inductance value of the inductor 44 is represented by L44. When the common terminal 32*a* is connected to the terminal 32*b* and when the common terminal 32*a* is connected (or is not connected) to the terminal 32*c*, the inductance value of the second variable inductor circuit will be L42. In contrast, when the common terminal 32*a* is not connected to the terminal 32*b* and when the common terminal 32*a* is connected to the terminal 32*c*, the inductance value of the second variable inductor circuit will be (L42+L44). L43 and L44 are, for example, 0.1 nH to 0.5 nH.

In the first variable inductor circuit, the first end of the inductor 41 may be connected to the connection terminal 101, and the first end of the inductor 43 and the terminal 31*c* may be connected to the connection terminal 102. In the second variable inductor circuit, the first end of the inductor 42 may be connected to the ground, and the first end of the inductor 44 and the terminal 32*b* may be connected to the connection terminal 101.

The inductance value of the inductor 41 may be greater than that of the inductor 43.

According to this, the inductor 41, having a high inductance value, is disposed on the signal path connected to the common terminal 31*a* and the inductor 43, having a low inductance value for fine adjustment, is disposed on the signal path connected to the terminal 31*b*. Thus, the number of inductors, which are to be disposed, may be reduced with respect to the inductance value required for the first variable inductor circuit, achieving a reduction in size of the first variable inductor circuit.

The inductance value of the inductor 42 may be greater than that of the inductor 44.

According to this, the inductor 42, having a high inductance value, is disposed on the signal path connected to the common terminal 32*a* and the inductor 44, having a low inductance value for fine adjustment, is disposed on the signal path connected to the terminal 32*c*. Thus, the number of inductors, which are to be disposed, may be reduced with respect to the inductance value required for the second variable inductor circuit, achieving a reduction in size of the second variable inductor circuit.

The PA control circuit 70, which is an exemplary control circuit, controls operations of the switches 31 and 32 on the basis of the measured value from the temperature sensor 61.

The PA control circuit 70 may be formed by using a single semiconductor IC (Integrated Circuit). The semiconductor IC has a configuration, for example, of the CMOS (Complementary Metal Oxide Semiconductor). Specifically, the semiconductor IC is formed by using a SOI (Silicon On Insulator) process. This enables the semiconductor IC to be manufactured at low cost. The semiconductor IC may be formed of at least any of GaAs, SiGe, and GaN.

The semiconductor IC may include the switches 31 and 32 in addition to the PA control circuit 70. This achieves a reduction in size of the radio frequency circuit 1.

The inductors 43 and 44 and the switches 31 and 32 may be included in a semiconductor IC 80. The semiconductor IC 80 may include the PA control circuit 70.

The radio frequency circuit 1 according to the present exemplary embodiment may have any configuration as long as it includes at least the acoustic wave filter 21, the power amplifier 11, the temperature sensor 61, and the inductors 41 and 42.

[2. The Circuit State of the Radio Frequency Circuit 1]

Figure 2A:
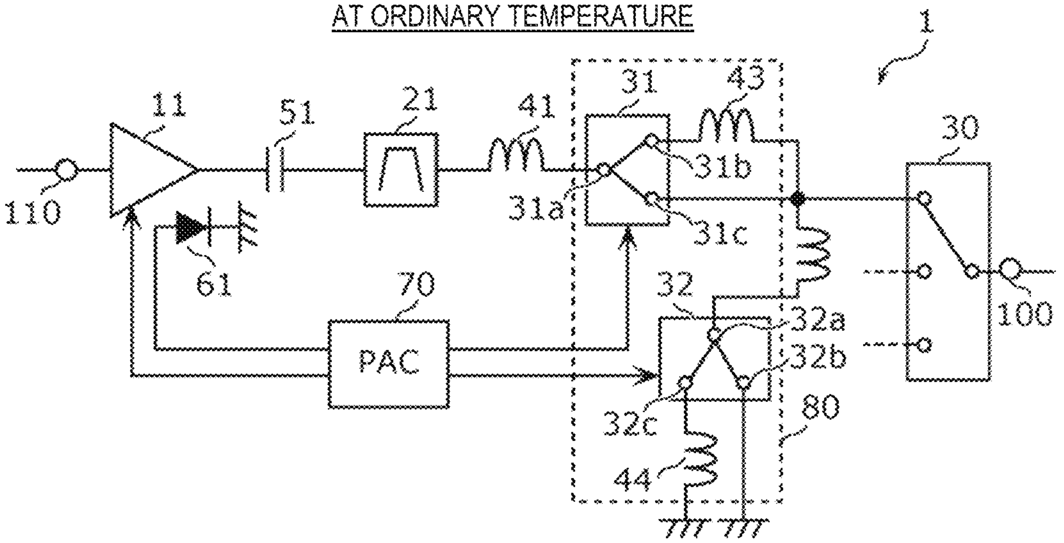
FIG. 2A is a diagram illustrating the circuit state of a radio frequency circuit at an ordinary temperature, according to an exemplary embodiment.
Figure 2B:
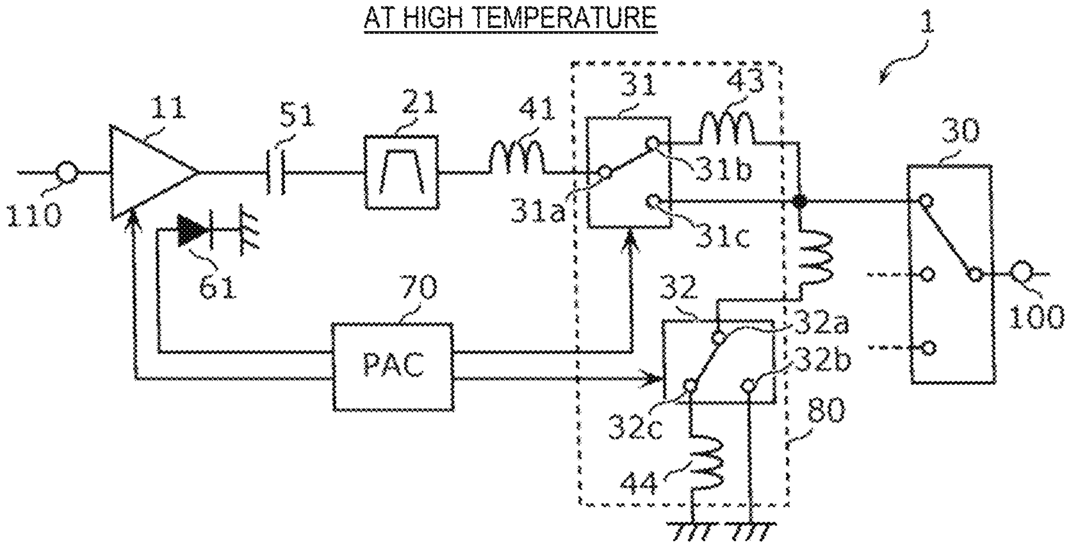
FIG. 2B is a diagram illustrating the circuit state of a radio frequency circuit at a high temperature, according to an exemplary embodiment.

FIG. 2A is a diagram illustrating the circuit state of the radio frequency circuit 1 at an ordinary temperature, according to the exemplary embodiment. FIG. 2B is a diagram illustrating the circuit state of the radio frequency circuit 1 at a high temperature, according to the exemplary embodiment.

As illustrated in FIG. 2A, in the radio frequency circuit 1 according to the present exemplary embodiment, when the temperature measured by the temperature sensor 61 is lower than or equal to a threshold temperature Tt, in the switch 31, the common terminal 31*a* is connected to the terminal 31*b* and the common terminal 31*a* is connected to the terminal 31*c*, the common terminal 32*a* is connected to the terminal 32*b*, and the common terminal 32*a* is connected to the terminal 32*c*.

According to this, at the ordinary temperature, the inductance value of the first variable inductor circuit will be L41, which is a relatively low series inductance value. The inductance value of the second variable inductor circuit will be L42, which is a relatively low shunt inductance value.

In contrast, as illustrated in FIG. 2B, in the radio frequency circuit 1 according to the present exemplary embodiment, when the temperature measured by the temperature sensor 61 is higher than the threshold temperature Tt, in the switch 31, the common terminal 31*a* is connected to the terminal 31*b*, the common terminal 31*a* is not connected to the terminal 31*c*, the common terminal 32*a* is not connected to the terminal 32*b*, and the common terminal 32*a* is connected to the terminal 32*c*.

According to this, at the high temperature, the inductance value of the first variable inductor circuit will be (L41+L43), which is a series inductance value higher than that of the first variable inductor circuit at the ordinary temperature. The inductance value of the second variable inductor circuit will be (L42+L44), which is a shunt inductance value higher than that of the second variable inductor circuit at the ordinary temperature.

When the radio frequency circuit 1 is transmitting a transmit signal from the transmission input terminal 110 to the antenna connection terminal 100, since a transmit signal, having high output of Power Class 2 or higher, is output from the power amplifier 11, the acoustic wave filter 21 enters the high temperature state due to heat generation. This causes a frequency shift and an impedance change to occur in the acoustic wave filter 21 with the temperature change.

Figure 3A:
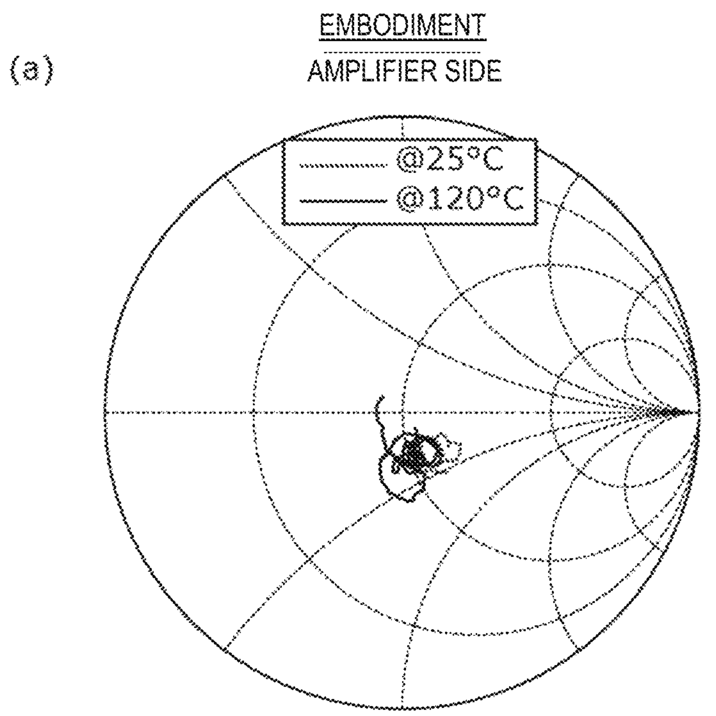
FIG. 3A is a Smith chart showing the input/output impedance of an acoustic wave filter included in a radio frequency circuit according to an exemplary embodiment.
Figure 3A:
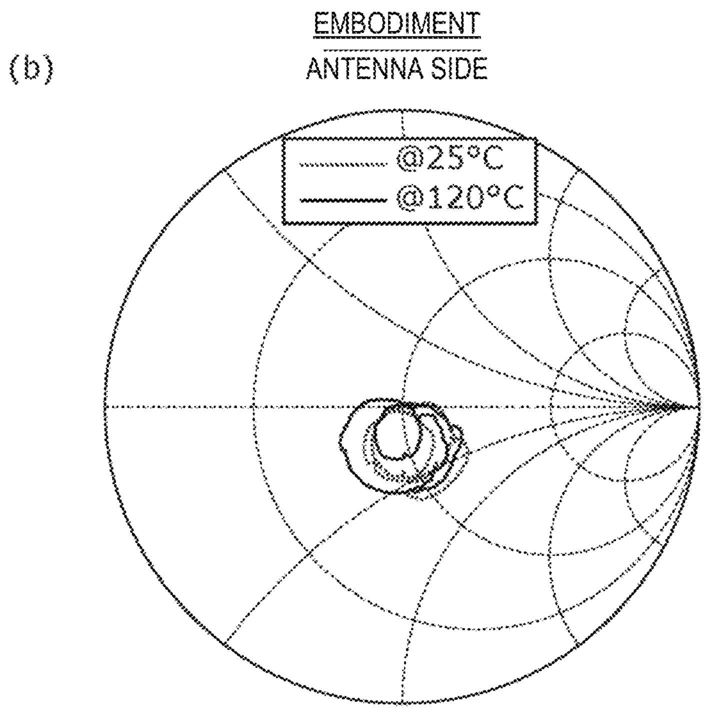
Figure 3B:
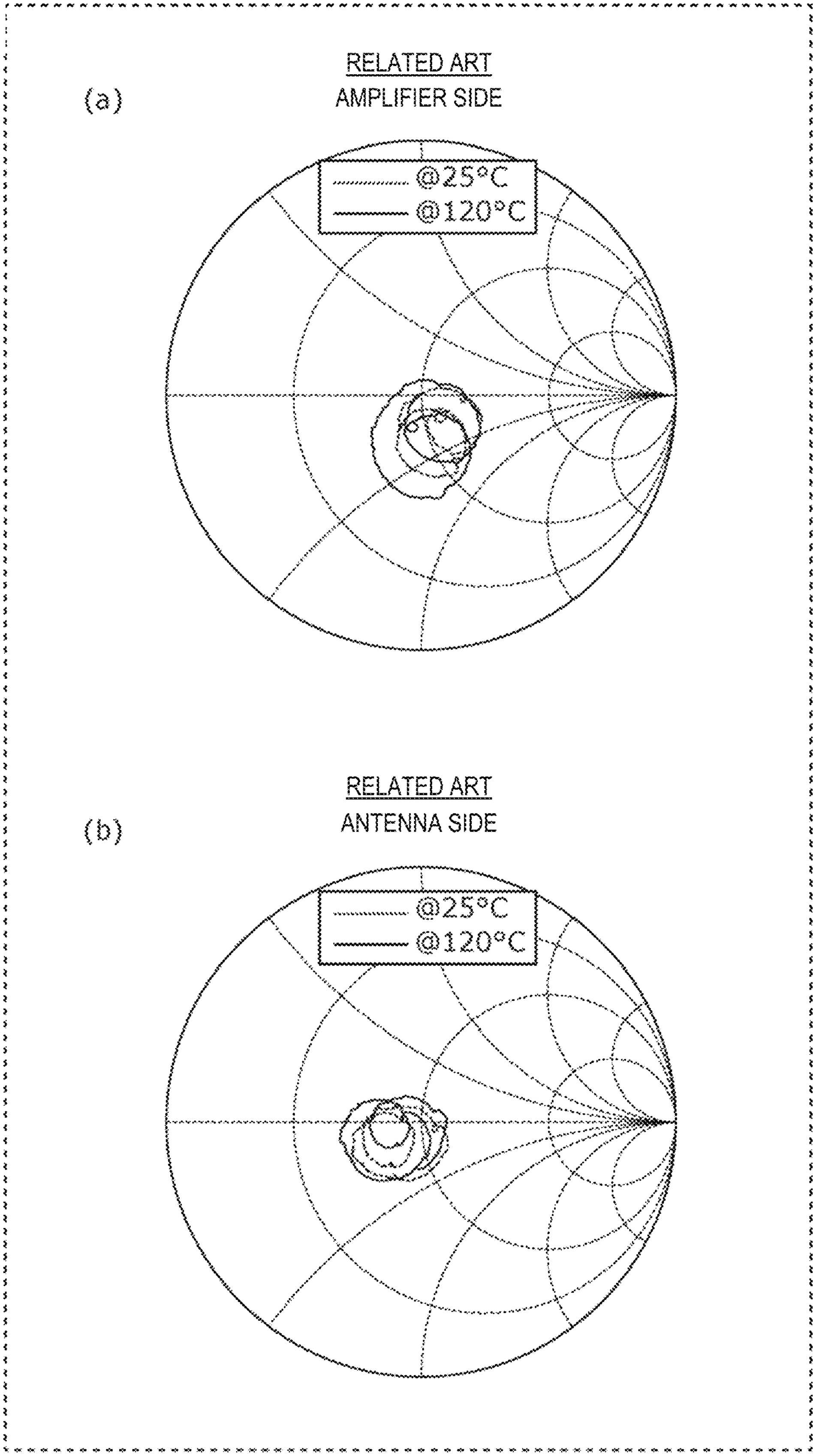
FIG. 3B is a Smith chart showing the input/output impedance of an acoustic wave filter included in a radio frequency circuit of the related art.

FIG. 3A is a Smith chart showing the input/output impedance of the acoustic wave filter 21 included in the radio frequency circuit 1 according to the exemplary embodiment. FIG. 3B is a Smith chart showing the input/output impedance of an acoustic wave filter included in a radio frequency circuit of the related art.

FIG. 3B illustrates the input/output impedance of an acoustic wave filter included in a radio frequency circuit of the related art. The radio frequency circuit of the related art does not include the first variable inductor circuit and the second variable inductor circuit. Therefore, as illustrated in FIG. 3B(a), the degree of concentration, in the passband, of the impedance on the power amplifier side of the acoustic wave filter degrades. The degree of concentration of impedance may be expressed quantitatively by using the coefficient of concentration CR. The coefficient of concentration CR may be derived by using Expression 1, where the radius of the minimum enclosing circle including all the impedance in the passband in a Smith chart is represented by r.

$$\text{Coefficient of concentration CR} = (1+r)/(1-r) \quad \text{(Expression 1)}$$

That is, the smaller the radius r is (the smaller the winding of impedance is), the smaller the coefficient of concentration CR is, and the higher the degree of concentration is. In contrast, the larger the radius r is (the larger the winding of impedance is), the larger the coefficient of concentration CR is, and the lower the degree of concentration is. As the coefficient of concentration CR of impedance on the power amplifier side of an acoustic wave filter is smaller (the degree of concentration is higher), the transmission characteristics such as the ACLR (Adjacent Leakage Power Ratio) of the radio frequency circuit improve.

In the radio frequency circuit of the related art in FIG. 3B(a), in particular, the degree of concentration of impedance on the power amplifier side of the acoustic wave filter at a high temperature (120° C.) degrades compared with that at an ordinary temperature (25° C.).

In contrast, FIG. 3A illustrates the input/output impedance of the acoustic wave filter 21 included in the radio frequency circuit 1 according to the present exemplary embodiment. In the radio frequency circuit 1 according to the present exemplary embodiment, the first variable inductor circuit and the second variable inductor circuit enable the impedance on the antenna 2 side of the acoustic wave filter 21 to be adjusted directly. As illustrated in FIG. 3A(b), the impedance on the antenna 2 side of the acoustic wave filter 21 is made higher by using the series inductance component of the first variable inductor circuit than the impedance on the antenna side of the acoustic wave filter illustrated in FIG. 3B(b), while the inductive property and the capacitive property are adjusted by using the shunt inductance component of the second variable inductor circuit.

As a result, as illustrated in FIG. 3A(b), the impedance on the antenna 2 side of the acoustic wave filter 21 is matched to the reference impedance (50Q). Thus, as illustrated in FIG. 3A(a), the degree of concentration of impedance on the power amplifier 11 side of the acoustic wave filter 21 improves by a large extent both at an ordinary temperature and at a high temperature (The coefficient of concentration CR decreases). For example, the coefficient of concentration CR at 85° C. is 1.4 or less.

In the radio frequency circuit 1 according to the present exemplary embodiment, the inductance values of the first variable inductor circuit and the second variable inductor circuit are adjusted by switching the switches 31 and 32. This enables suppression of an occurrence of the state in which a temperature rise causes deviation of the impedance of the acoustic wave filter 21 from the matching impedance or causes degradation of the degree of concentration of impedance in the passband. Thus, even when a transmit signal of high output of Power Class 2 or higher is output from the power amplifier 11, without lowering the temperature to decrease the output power of the transmit signal, the high output may be maintained even at a high temperature. Therefore, the ACLR at the high temperature in a high power mode may be improved.

The inductors included in the first variable inductor circuit and the second variable inductor circuit have an electric power handling capability higher than that of a circuit device such as a capacitor. Therefore, the inductance values of the first variable inductor circuit and the second variable inductor circuit, which are disposed on the transmit path through which a high-output transmit signal is transmitted, may be adjusted with high accuracy even in the high temperature state.

For transmitters of the related art (, a configuration in which the series inductance value of the variable load connected to the power amplifying circuit is adjusted on the basis of temperature information from the temperature sensor disposed near the power amplifying circuit. However, in the configuration of the related art, the series inductance value is adjusted to suppress a temperature rise of the power amplifying circuit, not to maintain desired transmit power in the high temperature state. That is, in the configuration of the related art, it is not possible to improve the ACLR at a high temperature in the high power mode.

In the present exemplary embodiment, the inductance values of the first variable inductor circuit and the second variable inductor circuit at a high temperature are made higher than those at an ordinary temperature. Thus, impedance matching of the acoustic wave filter 21 is made at the high temperature. Alternatively, depending on the frequency temperature characteristics of the acoustic wave filter 21, at least any of the inductance values of the first variable inductor circuit and the second variable inductor circuit at the high temperature may be adjusted to a low value.

The radio frequency circuit 1 according to the present exemplary embodiment includes the antenna connection terminal 100, the acoustic wave filter 21, the power amplifier 11 connected to the acoustic wave filter 21, a variable matching circuit connected between the acoustic wave filter 21 and the antenna connection terminal 100, and the PA control circuit 70 which controls the inductance of the variable matching circuit. When the temperature of the power amplifier 11 or the acoustic wave filter 21 is higher than the threshold temperature, the PA control circuit 70 may increase the inductance value of the variable matching circuit compared with the case in which the temperature is lower than or equal to the threshold temperature.

According to this, the inductance value of the variable matching circuit at a high temperature is increased. This enables suppression of deviation of the impedance of the acoustic wave filter 21 from the matching impedance due to a temperature rise. Thus, even when a high-output transmit signal is output from the power amplifier 11, without lowering the temperature to decrease the output power of the transmit signal, the high output may be maintained even at the high temperature.

The variable matching circuit includes the first variable inductor circuit, which is disposed in series between the acoustic wave filter 21 and the antenna connection terminal 100, and the second variable inductor circuit, which is connected between the ground and the first path connecting the acoustic wave filter 21 to the antenna connection terminal 100. When the temperature of the power amplifier 11 or the acoustic wave filter 21 is higher than the threshold temperature, the PA control circuit 70 may increase the inductance value of the first variable inductor circuit and increase the inductance value of the second variable inductor circuit compared with the case in which the temperature is lower than or equal to the threshold temperature.

According to this, the series inductance value and the shunt inductance value of the variable matching circuit are increased at a high temperature. This enables suppression of deviation of the impedance of the acoustic wave filter 21 from the matching impedance due to a temperature rise.

[3. The Mounting Configuration of the Radio Frequency Circuit 1]

The mounting configuration of the radio frequency circuit 1 according to the present exemplary embodiment will be described by referring to FIG. 4A.

Figure 4A:
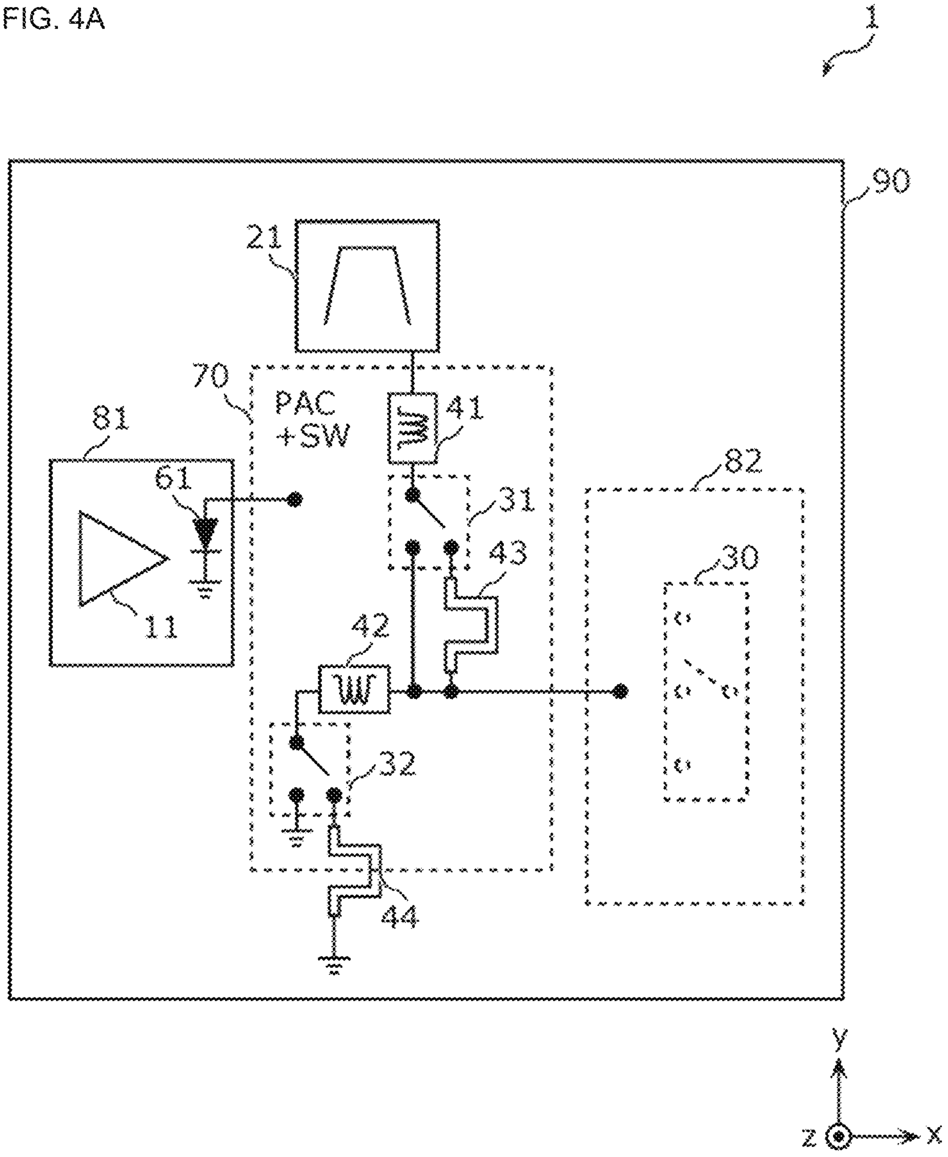
FIG. 4A is a plan view of a radio frequency circuit according to an exemplary embodiment.

FIG. 4A is a plan view of the radio frequency circuit 1 according to the exemplary embodiment. The plan view in FIG. 4A is a view in which the principal surfaces of a substrate 90 are seen through from the z-axis positive side. In FIG. 4A, for easy understanding of the layout relationship between the circuit devices and the substrate, circuit devices illustrated by using solid lines indicate being disposed on a first principal surface (the principal surface on the z-axis positive direction side) of the substrate 90 and circuit devices illustrated by using dashed lines indicate being disposed on a second principal surface (the principal surface on the z-axis negative direction side) of the substrate 90 or in the substrate 90. FIG. 4A illustrates marks representing the functions of the circuit devices. However, such marks are not attached to the actual circuit devices. In FIG. 4A, part of a wiring connecting the substrate 90 and the circuit devices is not illustrated.

The radio frequency circuit 1 may further include a resin member, which covers a surface of the substrate 90 and some of the circuit devices, and a shield electrode layer, which covers the surface of the resin member. In FIG. 4A, the resin member and the shield electrode layer are not illustrated.

The radio frequency circuit 1 further includes the substrate 90 in addition to the circuit configuration illustrated in FIG. 1. The capacitor 51, the antenna connection terminal 100, and the transmission input terminal 110, which are included in the radio frequency circuit 1, are not illustrated in FIG. 4A, and may be disposed on or in the substrate 90.

The substrate 90, which has the first principal surface and the second principal surface which are opposite each other, is a substrate on or in which the circuit devices included in the radio frequency circuit 1 are mounted. Examples of the substrate 90 include a low temperature co-fired ceramic (LTCC) substrate, a high temperature co-fired ceramic (HTCC) substrate, a component-embedded substrate, a substrate having a redistribution layer (RDL), and a printed circuit board, which have a multilayer structure of multiple dielectric layers.

The power amplifier 11, the acoustic wave filter 21, the temperature sensor 61, and the inductor 41 to 44 are disposed on the first principal surface of the substrate 90.

The power amplifier 11 is included in a semiconductor IC 81. The temperature sensor 61 may be embedded in the semiconductor IC 81 or may be disposed on the surface of the semiconductor IC 81.

The inductors 41 and 42 are chip-like surface mount inductors disposed on the first principal surface.

The inductors 43 and 44 are inductors which include coil conductors formed on the first principal surface of the substrate 90.

The switches 30 to 32 are disposed on the second principal surface of the substrate 90. The switch 30 is included in a semiconductor IC 82 disposed on the second principal surface, and the switches 31 and 32 are included in the PA control circuit 70 disposed on the second principal surface. That is, the PA control circuit 70 includes a control circuit which controls the first variable inductor circuit and the second variable inductor circuit. The PA control circuit 70 may be included in the semiconductor IC 80 (first semiconductor IC).

In the configuration described above, in the plan view of the first principal surface and the second principal surface of the substrate 90, at least part of the inductor 41 overlaps the PA control circuit 70 and at least part of the inductor 42 overlaps the PA control circuit 70.

According to this, connecting wiring between the inductor 41 and the switch 31 and connecting wiring between the inductor 42 and the switch 32 may be made short, achieving low loss and a reduction in size of the radio frequency circuit 1.

The mounting configuration of a radio frequency circuit 1A according to a first modified example will be described by referring to FIG. 4B.

Figure 4B:
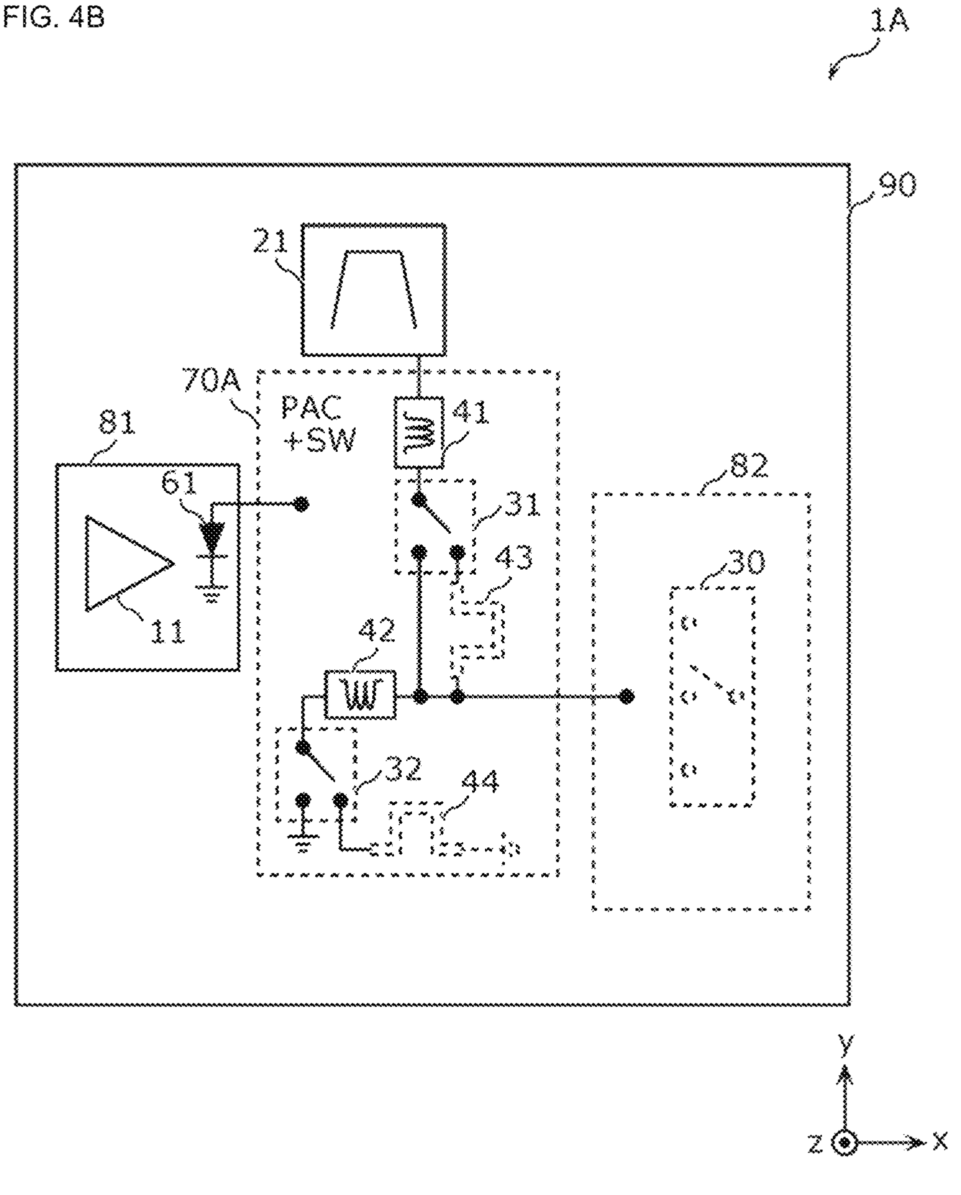
FIG. 4B is a plan view of a radio frequency circuit according to a first modified example.

FIG. 4B is a plan view of the radio frequency circuit 1A according to the first modified example. The plan view in FIG. 4B is a view in which the principal surfaces of the substrate 90 are seen through from the z-axis positive side. The radio frequency circuit 1A according to the present modified example is different from the radio frequency circuit 1 according to the exemplary embodiment only in the mounting configuration of the inductors 43 and 44. The radio frequency circuit 1A according to the present modified example will be described below by skipping the description about the same configuration as that of the radio frequency circuit 1 according to the exemplary embodiment and by focusing mainly on different configurations.

The power amplifier 11, the acoustic wave filter 21, the temperature sensor 61, and the inductors 41 and 42 are disposed on the first principal surface of the substrate 90.

The switches 30 to 32 and the inductors 43 and 44 are disposed on the second principal surface of the substrate 90. The switch 30 is included in the semiconductor IC 82 disposed on the second principal surface, and the switches 31 and 32 are included in a PA control circuit 70A disposed on the second principal surface. That is, the PA control circuit 70A includes the control circuit which controls the first variable inductor circuit and the second variable inductor circuit. The PA control circuit 70A may be included in the semiconductor IC 80 (first semiconductor IC).

The inductors 43 and 44 are inductors which include coil conductors formed in the PA control circuit 70A.

In the configuration described above, in the plan view of the first principal surface and the second principal surface of the substrate 90, at least part of the inductor 41 overlaps the PA control circuit 70A and at least part of the inductor 42 overlaps the PA control circuit 70A.

According to this, the connecting wiring between the inductor 41 and the switch 31 and the connecting wiring between the inductor 42 and the switch 32 may be made short, achieving low loss and a reduction in size of the radio frequency circuit 1A.

[4. The Circuit Configuration of a Radio Frequency Circuit 1B According to a Second Modified Example]

Figure 5:
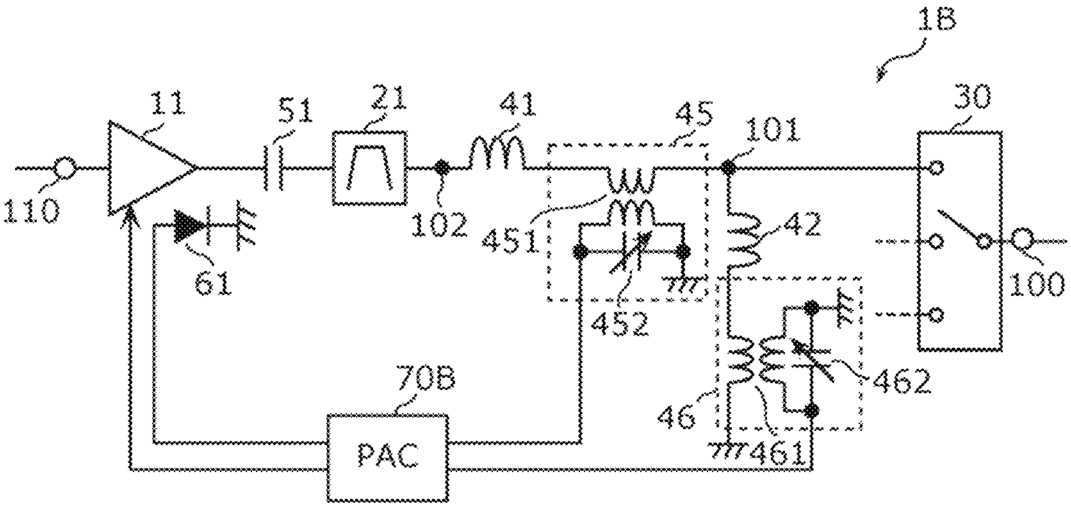
FIG. 5 is a diagram illustrating the circuit configuration of a radio frequency circuit according to a second modified example.

FIG. 5 is a diagram illustrating the circuit configuration of a radio frequency circuit 1B according to a second modified example. As illustrated in FIG. 5, the radio frequency circuit 1B includes the antenna connection terminal 100, the acoustic wave filter 21, the power amplifier 11, the temperature sensor 61, the inductors 41 and 42, variable inductors 45 and 46, the switch 30, a PA control circuit 70B, the capacitor 51, and the transmission input terminal 110.

The radio frequency circuit 1B according to the present modified example is different from the radio frequency circuit 1 according to the exemplary embodiment in the configuration of the first variable inductor circuit and the second variable inductor circuit. The radio frequency circuit 1B according to the present modified example will be described below by skipping the same configuration as that of the radio frequency circuit 1 according to the exemplary embodiment and by focusing mainly on different configurations.

The variable inductor 45 has a transformer 451 and a variable capacitor 452. The transformer 451 has a third inductor and a fourth inductor which are electromagnetically coupled to each other. The variable capacitor 452 is an exemplary first variable capacitor.

The variable inductor 46 has a transformer 461 and a variable capacitor 462. The transformer 461 has a fifth inductor and a sixth inductor which are electromagnetically coupled to each other. The variable capacitor 462 is an exemplary second variable capacitor.

The transformer 451 may be a directional coupler having a main line (third inductor) and a secondary line (fourth inductor) which are electromagnetically coupled to each other. The transformer 461 may be a directional coupler having a main line (fifth inductor) and a secondary line (sixth inductor) which are electromagnetically coupled to each other.

The inductor 41, which is an exemplary first inductor, is disposed in series between the acoustic wave filter 21 and the antenna connection terminal 100. Specifically, the inductor 41 is connected, at its first end, to the connection terminal 102, and is connected, at its second end, to a first end of the third inductor. The third inductor is connected, at its second end, to the connection terminal 101. A first end of the fourth inductor is connected to a first end of the variable capacitor 452. A second end of the fourth inductor and a second end of the variable capacitor 452 are connected to the ground. A first variable voltage is suppled from the PA control circuit 70B to the first end of the fourth inductor and the first end of the variable capacitor 452. The capacitance value of the variable capacitor 452 changes in accordance with the voltage value of the first variable voltage. The inductance value of the variable inductor 45 changes in accordance with the change of the capacitance value. The voltage value of the first variable voltage changes in accordance with temperature information measured by the temperature sensor 61. That is, the inductance value of the variable inductor 45 changes in accordance with the temperature information measured by the temperature sensor 61.

The inductor 42, which is an exemplary second inductor, is connected between the first path and the ground. Specifically, the inductor 42 is connected, at its first end, to the connection terminal 101, and is connected, at its second end, to a first end of the fifth inductor. The fifth inductor is connected, at its second end, to the ground. A first end of the sixth inductor is connected to a first end of the variable capacitor 462. A second end of the sixth inductor and a second end of the variable capacitor 462 are connected to the ground. A second variable voltage is supplied from the PA control circuit 70B to the first end of the sixth inductor and the first end of the variable capacitor 462. The capacitance value of the variable capacitor 462 changes in accordance with the voltage value of the second variable voltage, and the inductance value of the variable inductor 46 changes in accordance with the change of the capacitance value. The voltage value of the second variable voltage changes in accordance with the temperature information measured by the temperature sensor 61. That is, the inductance value of the variable inductor 46 changes in accordance with the temperature information measured by the temperature sensor 61.

In the connection configuration described above, the inductor 41, the variable inductor 45, and the connection terminals 101 and 102 form the first variable inductor circuit. The variable inductance value of the variable inductor 45 causes the inductance value of the first variable inductor circuit to be made variable.

In the connection configuration described above, the inductor 42 and the variable inductor 46 form the second variable inductor circuit. The variable inductance value of the variable inductor 46 causes the inductance value of the second variable inductor circuit to be made variable.

In the first variable inductor circuit, the first end of the inductor 41 may be connected to the connection terminal 101 and the first end of the third inductor may be connected to the connection terminal 102. In the second variable inductor circuit, the first end of the inductor 42 may be connected to the ground and the first end of the fifth inductor may be connected to the connection terminal 101.

The PA control circuit 70B, which is an exemplary control circuit, controls the inductance values of the variable inductors 45 and 46 on the basis of the measured value from the temperature sensor 61.

The PA control circuit 70B may be formed by using a single semiconductor IC.

The semiconductor IC may include part of the variable capacitors 452 and 462 in addition to the PA control circuit 70B. This achieves a reduction in size of the radio frequency circuit 1B.

In the radio frequency circuit 1B according to the present modified example, the inductance values of the first variable inductor circuit and the second variable inductor circuit may be adjusted by changing the inductance values of the variable inductors 45 and 46. This enables suppression of occurrence of the state in which a temperature rise causes deviation of the impedance of the acoustic wave filter 21 from the matching impedance or causes degradation of the degree of concentration of impedance in the passband. Thus, even when a transmit signal of high output of Power Class 2 or higher is output from the power amplifier 11, without lowering the temperature to decrease the output power of the transmit signal, the high output may be maintained even at a high temperature. Therefore, the ACLR at the high temperature in the high power mode may be improved.

Each inductor included in the first variable inductor circuit and the second variable inductor circuit has an electric power handling capability higher than that of a circuit device such as a capacitor. Therefore, the inductance values of the first variable inductor circuit and the second variable inductor circuit, which are disposed on the transmit path through which a high-output transmit signal is transmitted, may be adjusted with high accuracy even in the high temperature state.

[5. The Mounting Configuration of the Radio Frequency Circuit 1B According to the Second Modified Example]

The mounting configuration of the radio frequency circuit 1B according to the second modified example will be described by referring to FIG. 6.

Figure 6:
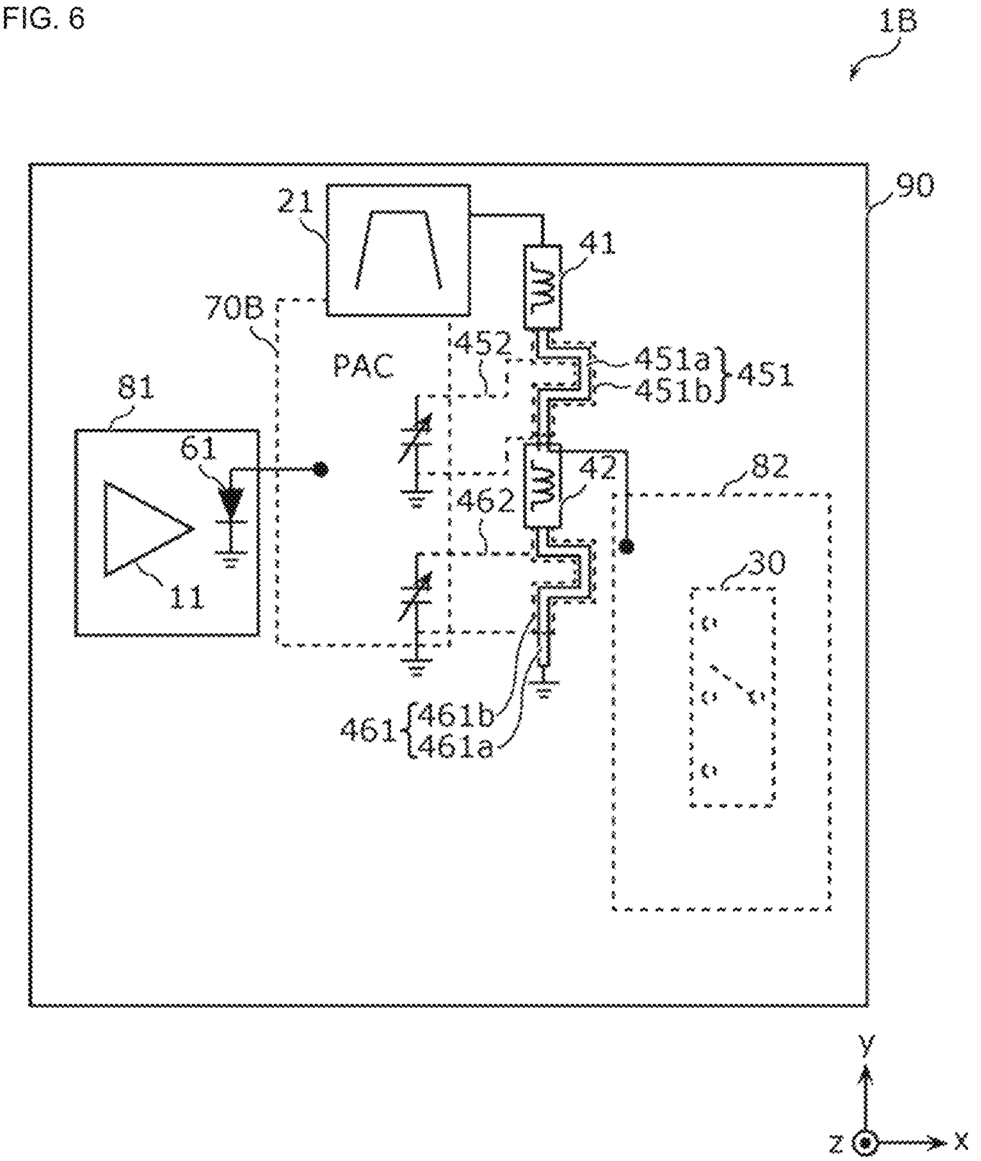
FIG. 6 is a plan view of a radio frequency circuit according to the second modified example.

FIG. 6 is a plan view of the radio frequency circuit 1B according to the second modified example. The plan view in FIG. 6 is a view in which the principal surfaces of the substrate 90 are seen through from the z-axis positive side. The radio frequency circuit 1B according to the present modified example is different from the radio frequency circuit 1 according to the exemplary embodiment only in the mounting configuration of the first variable inductor circuit, the second variable inductor circuit, and the PA control circuit 70B. The radio frequency circuit 1B according to the present modified example will be described below by skipping the same configuration as that of the radio frequency circuit 1 according to the exemplary embodiment and by focusing mainly on different configurations.

The radio frequency circuit 1B further has the substrate 90 in addition to the circuit configuration illustrated in FIG. 5. The capacitor 51, the antenna connection terminal 100, and the transmission input terminal 110, which are included in the radio frequency circuit 1B, are not illustrated in FIG. 6, and may be disposed on or in the substrate 90.

The power amplifier 11, the acoustic wave filter 21, the temperature sensor 61, the inductors 41 and 42, an inductor 451*a* (third inductor) of the transformer 451, and an inductor 461*a* (fifth inductor) of the transformer 461 are disposed on the first principal surface of the substrate 90.

The inductors 41 and 42 are chip-like surface mount inductors disposed on the first principal surface.

The inductors 451*a* and 461*a* are inductors which include coil conductors formed on the first principal surface of the substrate 90.

An inductor 451*b* (fourth inductor) of the transformer 451 and an inductor 461*b* (sixth inductor) of the transformer 461 are inductors which include coil conductors formed in the substrate 90.

In the plan view of the substrate 90, the inductor 451*a* overlaps the inductor 451*b* at least partially and the inductor 461*a* overlaps the inductor 461*b* at least partially.

The switch 30 and the PA control circuit 70B are disposed on the second principal surface of the substrate 90. The switch 30 is included in the semiconductor IC 82 disposed on the second principal surface. The PA control circuit 70B is an exemplary first semiconductor IC. At least part (a portion generating the first variable voltage) of the variable capacitor 452 and at least part (a portion generating the second variable voltage) of the variable capacitor 462 are formed in the substrate 90 or on the second principal surface.

According to the configuration described above, the inductor 451*a* overlaps the inductor 451*b* in the plan view of the substrate 90 and the inductor 461*a* overlaps the inductor 461*b* in the plan view of the substrate 90, achieving a reduction in size of the transformers 451 and 461 and a reduction in size of the radio frequency circuit 1B.

[6. The Circuit Configuration of a Radio Frequency Circuit 1C According to a Third Modified Example]

Figure 7:
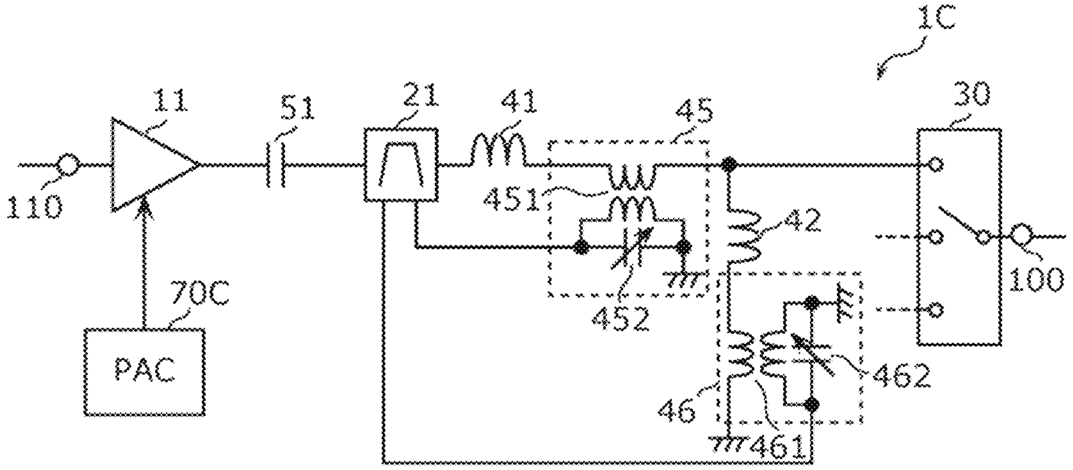
FIG. 7 is a diagram illustrating the circuit configuration of a radio frequency circuit according to a third modified example.

FIG. 7 is a diagram illustrating the circuit configuration of a radio frequency circuit 1C according to a third modified example. As illustrated in FIG. 7, the radio frequency circuit 1C includes the antenna connection terminal 100, the acoustic wave filter 21, the power amplifier 11, the inductors 41 and 42, the variable inductors 45 and 46, the switch 30, a PA control circuit 70C, the capacitor 51, and the transmission input terminal 110.

The radio frequency circuit 1C according to the present modified example is different from the radio frequency circuit 1B according to the second modified example in the configuration of the first variable inductor circuit, the second variable inductor circuit, and the temperature sensor. The radio frequency circuit 1C according to the present modified example will be described below by skipping the same configuration as that of the radio frequency circuit 1B according to the second modified example and by focusing mainly on different configurations.

At least part of the variable capacitor 452 includes an IDT electrode of the acoustic wave filter 21. A pair of comb-like electrodes included in the IDT electrode of the acoustic wave filter 21 constitute an interdigital capacitance device. The interdigital capacitance device has a capacitance value which changes in accordance with a temperature change. Detection of the capacitance value of the interdigital capacitance device enables temperature information of the acoustic wave filter 21 to be obtained. That is, the IDT electrode of the acoustic wave filter 21 is a temperature sensor which detects the temperature of the acoustic wave filter 21. The capacitance value of the variable capacitor 452 changes in accordance with the capacitance value of the IDT electrode of the acoustic wave filter 21 and the inductance value of the variable inductor 45 changes in accordance with the change of the capacitance value. That is, the capacitance value of the IDT electrode of the acoustic wave filter 21 changes in accordance with the temperature of the acoustic wave filter 21, and the inductance value of the variable inductor 45 changes in accordance with the temperature information of the acoustic wave filter 21.

At least part of the variable capacitor 462 includes an IDT electrode of the acoustic wave filter 21. A pair of comb-like electrodes included in the IDT electrode of the acoustic wave filter 21 constitute an interdigital capacitance device. The interdigital capacitance device has a capacitance value which changes in accordance with a temperature change. Detection of the capacitance value of the interdigital capacitance device enables temperature information of the acoustic wave filter 21 to be obtained. That is, the IDT electrode of the acoustic wave filter 21 is a temperature sensor which detects the temperature of the acoustic wave filter 21. The capacitance value of the variable capacitor 462 changes in accordance with the capacitance value of the IDT electrode of the acoustic wave filter 21 and the inductance value of the variable inductor 46 changes in accordance with the change of the capacitance value. That is, the capacitance value of the IDT electrode of the acoustic wave filter 21 changes in accordance with the temperature of the acoustic wave filter 21, and the inductance value of the variable inductor 46 changes in accordance with the temperature information of the acoustic wave filter 21.

The PA control circuit 70C according to the present modified example, which is an exemplary control circuit, controls the power amplifier 11. The PA control circuit 70C does not necessarily control the inductance values of the variable inductors 45 and 46. The PA control circuit 70C may be formed by using a single semiconductor IC.

In the radio frequency circuit 1C according to the present modified example, the inductance values of the first variable inductor circuit and the second variable inductor circuit are adjusted by changing the inductance values of the variable inductors 45 and 46. This enables suppression of deviation of the impedance of the acoustic wave filter 21 from the matching impedance due to a temperature rise. Thus, even when a transmit signal of high output of Power Class 2 or higher is output from the power amplifier 11, without lowering the temperature to decrease the output power of the transmit signal, the high output may be maintained even at a high temperature. Therefore, the ACLR at the high temperature in the high power mode may be improved.

[7. The Mounting Configuration of the Radio Frequency Circuit 1C According to the Third Modified Example]

The mounting configuration of the radio frequency circuit 1C according to the third modified example will be described by referring to FIG. 8.

Figure 8:
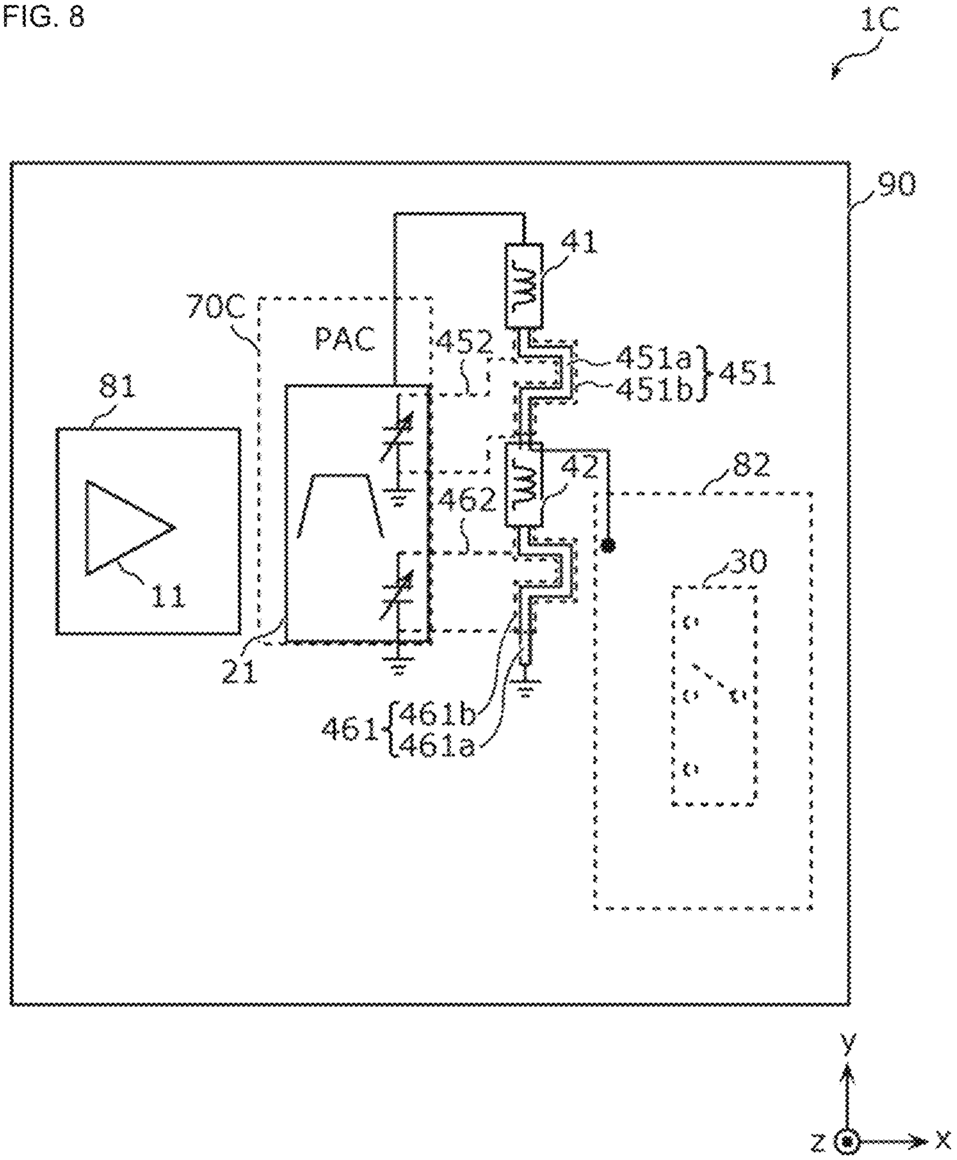
FIG. 8 is a plan view of a radio frequency circuit according to the third modified example.

FIG. 8 is a plan view of the radio frequency circuit 1C according to the third modified example. The plan view in FIG. 8 is a view in which the principal surfaces of the substrate 90 are seen through from the z-axis positive side. The radio frequency circuit 1C according to the present modified example is different from the radio frequency circuit 1B according to the second modified example in that the temperature sensor 61 is not disposed and in the position of placement of the acoustic wave filter 21. The radio frequency circuit 1C according to the present modified example will be described below by skipping the same configuration as that of the radio frequency circuit 1B according to the second modified example and by focusing mainly on different configurations.

The radio frequency circuit 1C further has the substrate 90 in addition to the circuit configuration illustrated in FIG. 7.

The power amplifier 11, the acoustic wave filter 21, the inductors 41 and 42, and the inductors 451*a* and 461*a* are disposed on the first principal surface of the substrate 90.

The inductors 41 and 42 are chip-like surface mount inductors disposed on the first principal surface.

The inductors 451*a* and 461*a* are inductors which include coil conductors formed on the first principal surface of the substrate 90.

The inductors 451*b* and 461*b* are inductors which include coil conductors formed in the substrate 90.

In the plan view of the substrate 90, the inductor 451*a* overlaps the inductor 451*b* at least partially and the inductor 461*a* overlaps the inductor 461*b* at least partially.

According to this, the inductor 451*a* overlaps the inductor 451*b* in the plan view of the substrate 90 and the inductor 461*a* overlaps the inductor 461*b* in the plan view of the substrate 90, achieving a reduction in size of the transformers 451 and 461.

At least part of the variable capacitor 452 and at least part of the variable capacitor 462 include an IDT electrode of the acoustic wave filter 21. The transformer 451 and the acoustic wave filter 21 are disposed close to each other. The transformer 461 and the acoustic wave filter 21 are disposed close to each other.

According to this, the variable inductor 45, which is constituted by the transformer 451 and the variable capacitor 452, and the variable inductor 46, which is constituted by the transformer 461 and the variable capacitor 462, may be reduced in size, achieving a reduction in size of the radio frequency circuit 1C.

[8. The Circuit Configuration of a Radio Frequency Circuit 1D and a Communication Device 4D According to a Fourth Modified Example]

Figure 9:
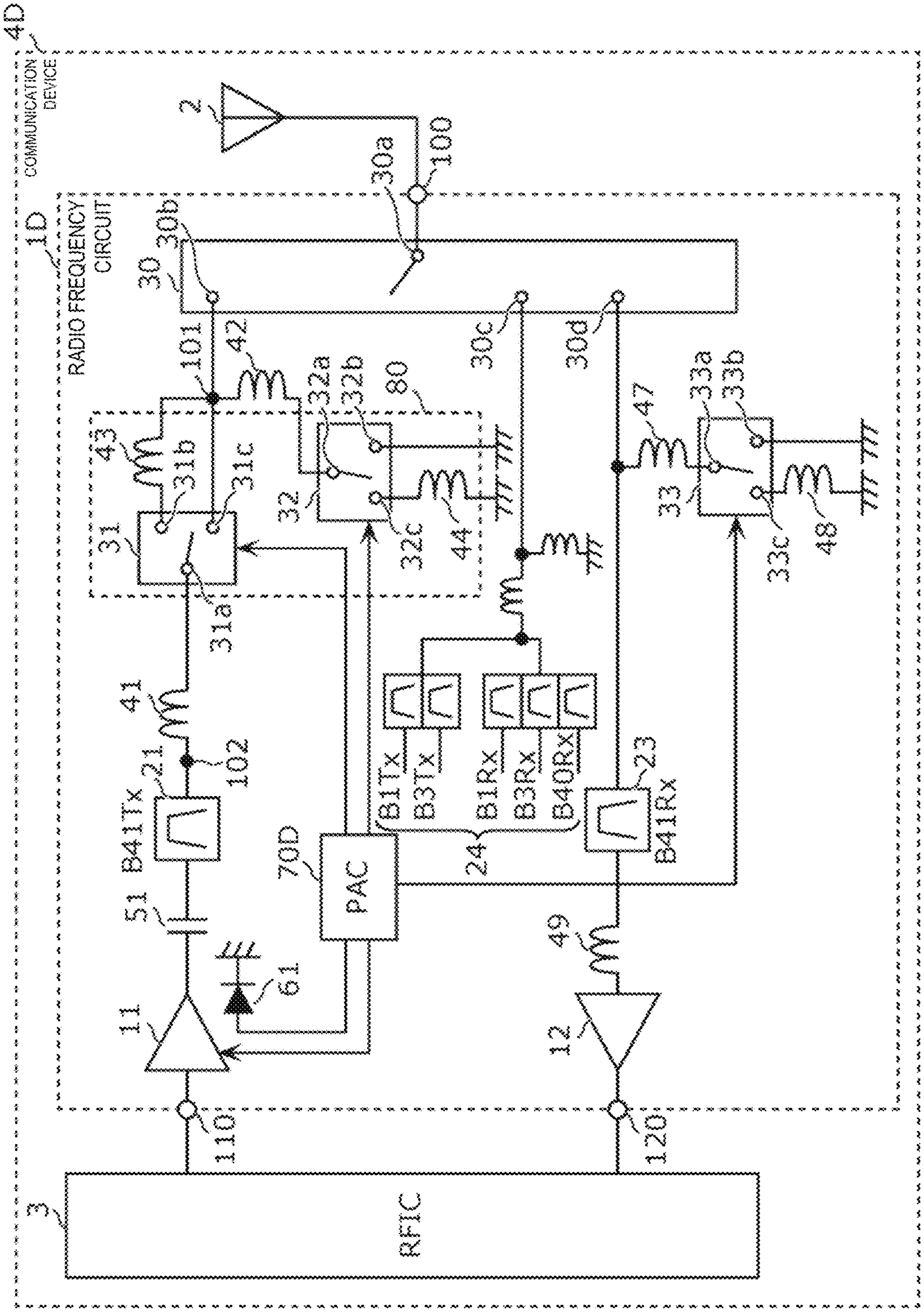
FIG. 9 is a diagram illustrating the circuit configuration of a radio frequency circuit and a communication device according to a fourth modified example.

FIG. 9 is a diagram illustrating the circuit configuration of a radio frequency circuit 1D and a communication device 4D according to a fourth modified example. As illustrated in FIG. 9, the communication device 4D includes the radio frequency circuit 1D, the antenna 2, and the RFIC 3. The communication device 4D according to the present modified example is different from the communication device 4 according to the exemplary embodiment in the configuration of the radio frequency circuit 1D. In the communication device 4D according to the present modified example, the radio frequency circuit 1D, which has a configuration different from that of the communication device 4 according to the exemplary embodiment, will be described below.

As illustrated in FIG. 9, the radio frequency circuit 1D includes the antenna connection terminal 100, acoustic wave filters 21 and 23, the power amplifier 11, a low-noise amplifier 12, the temperature sensor 61, inductors 41, 42, 43, 44, 47, 48, and 49, switches 30, 31, 32, and 33, a PA control circuit 70D, the capacitor 51, the transmission input terminal 110, and a reception output terminal 120. The radio frequency circuit 1D according to the present modified example is different from the radio frequency circuit 1 according to the exemplary embodiment mainly in that a receive path is added. The radio frequency circuit 1D according to the present modified example will be described below by skipping the same configuration as that of the radio frequency circuit 1 according to the exemplary embodiment and by focusing mainly on different configurations.

The reception output terminal 120 is connected to the RFIC 3.

The acoustic wave filter 23, which is an exemplary second acoustic wave filter, has one or more acoustic wave resonators. The acoustic wave filter 23 is connected, at its output end, to the input end of the low-noise amplifier 12 through the inductor 49, and is connected, at its input end, to a terminal 30*d* of the switch 30. The acoustic wave filter 23 has a passband including a first receive band. The first receive band includes, as a passband, the downlink operating band of an FDD band or a TDD band.

As an FDD band, for example, Band B1 or Band B3 is used. As a TDD band, for example, Band B40 or Band B41 is used.

The low-noise amplifier 12 is capable of amplifying radio frequency signals in the first receive band. The low-noise amplifier 12 is connected, at its output end, to the reception output terminal 120, and is connected, at its input end, to the output end of the acoustic wave filter 23 through the inductor 49.

The switch 30, which is an exemplary third switch, has a common terminal 30*a* (third common terminal) and terminals 30*b* (fifth terminal), 30*c*, and 30*d* (sixth terminal). The switch 30 switches between connection and non-connection between the common terminal 30*a* and the terminals 30*b*, 30*c*, and 30*d*. The common terminal 30*a* of the switch 30 is connected to the antenna connection terminal 100; the terminal 30*b*, to the connection terminal 101; the terminal 30*c*, to a multiplexer 24; and the terminal 30*d*, to the input end of the acoustic wave filter 23.

The switch 33, which has a common terminal 33*a* and terminals 33*b* and 33*c*, switches between connection and non-connection between the common terminal 33*a* and the terminal 33*b*, and switches between connection and non-connection between the common terminal 33*a* and the terminal 33*c*.

The inductor 47, which is an exemplary seventh inductor, is connected between the ground and the receive path connecting the acoustic wave filter 23 to the terminal 30*d*. Specifically, the inductor 47 is connected, at its first end, to a node on the receive path, and is connected, at its second end, to the common terminal 33*a*.

The inductor 48 is connected, at its first end, to the ground, and is connected, at its second end, to the terminal 33*c*.

The terminal 33*b* is connected to the ground.

In the connection configuration described above, the switch 33 and the inductors 47 and 48 form a third variable inductor circuit whose inductance value is made variable by switching the switch 33. The inductance value of the inductor 47 is represented by L47 and the inductance value of the inductor 48 is represented by L48. When the common terminal 33*a* is connected to the terminal 33*b* and the common terminal 33*a* is connected (or is not connected) to the terminal 33*c*, the inductance value of the third variable inductor circuit will be L47. In contrast, when the common terminal 33*a* is not connected to the terminal 33*b* and the common terminal 33*a* is not connected to the terminal 33*c*, the inductance value of the third variable inductor circuit will be (L47+L48). L48 is, for example 0.1 nH to 0.5 nH. The inductance value of the inductor 47 may be higher than that of the inductor 48.

According to this, the inductor 47, which has a high inductance value, is disposed on the signal path connected to the common terminal 33*a* and the inductor 48, which has a low inductance value for fine adjustment, is disposed on the signal path connected to the terminal 33*c*. Thus, the number of inductors, which are to be disposed, may be reduced with respect to the inductance value required for the third variable inductor circuit, achieving a reduction in size of the third variable inductor circuit.

The PA control circuit 70D, which is an exemplary control circuit, controls operations of the switches 31, 32, and 33 on the basis of the measured value from the temperature sensor 61. The PA control circuit 70D controls the first variable inductor circuit, the second variable inductor circuit, and the third variable inductor circuit.

The PA control circuit 70D may be formed by using a single semiconductor IC 80 which may include the switches 31 to 33 in addition to the PA control circuit 70D. This achieves a reduction in size of the radio frequency circuit 1D.

The multiplexer 24 is connected to the terminal 30*c*. The multiplexer 24 is constituted, for example, by a filter for transmission in Band B1, a filter for transmission in Band B3, a filter for reception in Band B1, a filter for reception in Band B3, and a filter for Band B40. The filter configuration of the multiplexer 24 is not limited to the configuration described above.

When the temperature measured by the temperature sensor 61 is higher than the threshold temperature, the inductance value of the third variable inductor circuit may be made higher compared with the case in which the temperature measured by the temperature sensor 61 is lower than or equal to the threshold temperature.

For example, when the temperature measured by the temperature sensor 61 is lower than or equal to the threshold temperature Tt, in the switch 33, the common terminal 33*a* is connected to the terminal 33*b* and the common terminal 33*a* is connected to the terminal 33*c*.

According to this, the inductance value of the third variable inductor circuit at an ordinary temperature will be L47 which is a relatively low shunt inductance value.

In contrast, when the temperature measured by the temperature sensor 61 is higher than the threshold temperature Tt, the common terminal 33*a* is not connected to the terminal 33*b* and the common terminal 33*a* is connected to the terminal 33*c*.

According to this, the inductance value of the third variable inductor circuit at a high temperature will be (L47+L48), which is a shunt inductance value higher than the inductance value of the third variable inductor circuit at the ordinary temperature.

In the radio frequency circuit 1D according to the present modified example, the inductance values of the first variable inductor circuit and the second variable inductor circuit are adjusted by switching the switches 31 and 32, achieving suppression of deviation of the impedance of the acoustic wave filter 21 from the matching impedance due to a temperature rise. In addition, the inductance value of the third variable inductor circuit is adjusted by switching the switch 33, achieving suppression of deviation of the impedance of the acoustic wave filter 23 from the matching impedance due to a temperature rise. Therefore, degradation of the BER (Bit Error Rate) of receive signals may be prevented.

In addition, the transmit path and the receive path are connected to the respective different terminals 30*b* and 30*d*. Thus, adjustment of the first variable inductor circuit and the second variable inductor circuit on the transmit path and adjustment of the third variable inductor circuit on the receive path may be performed individually without interfering with each other.

[9. The Mounting Configuration of the Radio Frequency Circuit 1D According to the Fourth Modified Example]

The mounting configuration of the radio frequency circuit 1D according to the fourth modified example will be described by referring to FIG. 10.

Figure 10:
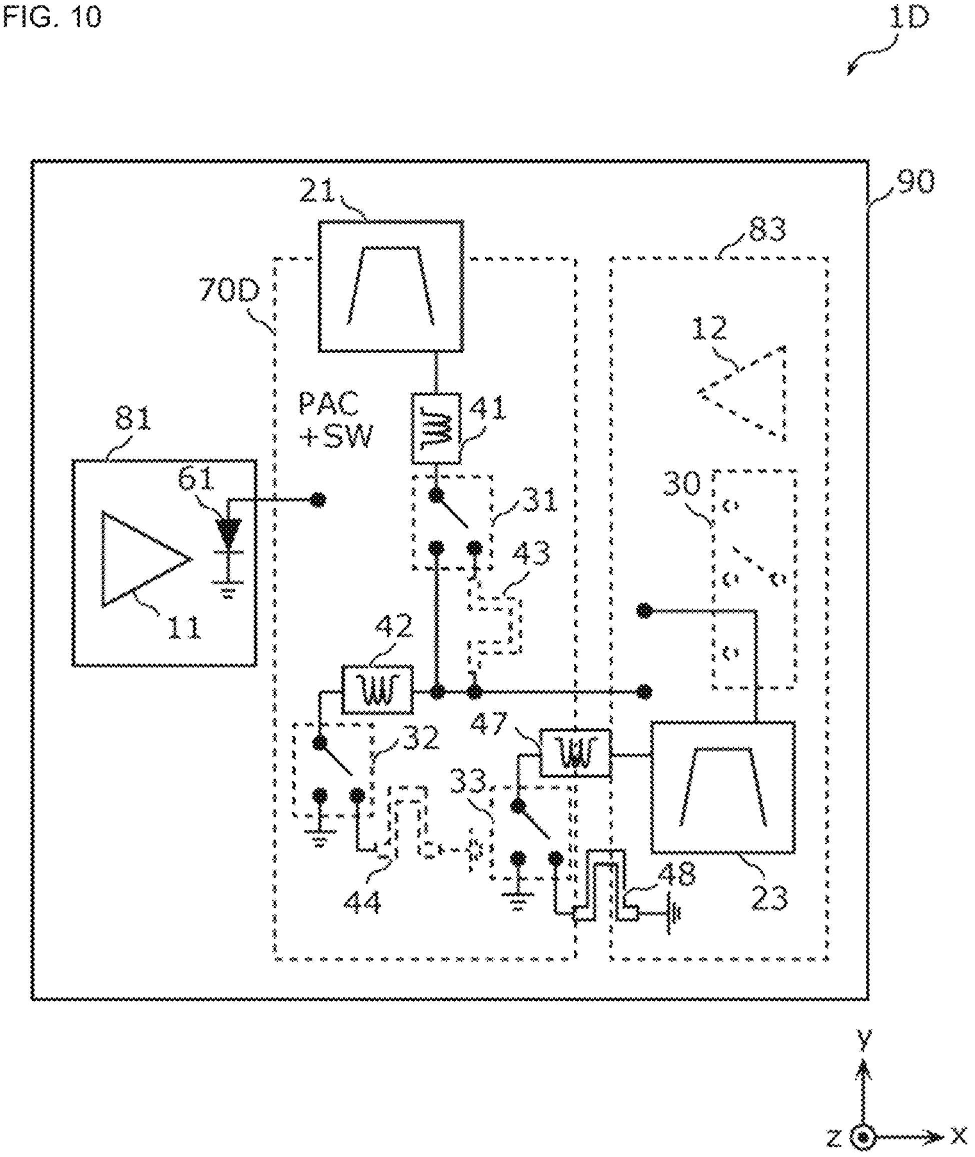
FIG. 10 is a plan view of a radio frequency circuit according to the fourth modified example.

FIG. 10 is a plan view of the radio frequency circuit 1D according to the fourth modified example. The plan view in FIG. 10 is a view in which the principal surfaces of the substrate 90 are seen through from the z-axis positive side. The radio frequency circuit 1D according to the present modified example is different from the radio frequency circuit 1 according to the exemplary embodiment in that the acoustic wave filter 23, the low-noise amplifier 12, and the third variable inductor circuit, which configure the receive path, are added. The radio frequency circuit 1D according to the present modified example will be described below by skipping the same configuration as that of the radio frequency circuit 1 according to the exemplary embodiment and by focusing mainly on different configurations.

The power amplifier 11, the acoustic wave filters 21 and 23, the temperature sensor 61, and the inductors 41 42, 47, and 48 are disposed on the first principal surface of the substrate 90.

The inductors 41 42, and 47 are chip-like surface mount inductors disposed on the first principal surface.

The inductor 48 is an inductor which includes a coil conductor formed on the first principal surface of the substrate 90.

The switches 30 to 33 and the low-noise amplifier 12 are disposed on the second principal surface of the substrate 90. The switch 30 and the low-noise amplifier 12 are included in a semiconductor IC 83 disposed on the second principal surface, and the switches 31 to 33 are included in the PA control circuit 70D disposed on the second principal surface. That is, the PA control circuit 70D includes the control circuit which controls the first variable inductor circuit, the second variable inductor circuit, and the third variable inductor circuit. The PA control circuit 70D is an exemplary first semiconductor IC.

The inductors 43 and 44 are inductors which include coil conductors formed in the PA control circuit 70D.

In the configuration described above, in the plan view of the first principal surface and the second principal surface of the substrate 90, at least part of the inductor 41 overlaps the PA control circuit 70D; at least part of the inductor 42 overlaps the PA control circuit 70D; and at least part of the inductor 47 overlaps the PA control circuit 70D.

According to this, the connecting wiring between the inductor 41 and the switch 31, the connecting wiring between the inductor 42 and the switch 32, and the connecting wiring between the inductor 47 and the switch 33 may be made short, achieving low loss and a reduction in size of the radio frequency circuit 1D.

As described above, the radio frequency circuit 1 according to the present exemplary embodiment includes the antenna connection terminal 100, the acoustic wave filter 21, the power amplifier 11 connected to the acoustic wave filter 21, the temperature sensor 61 which measures the temperature of either one or both of the acoustic wave filter 21 and the power amplifier 11, and the first variable inductor circuit which includes the inductor 41 disposed in series between the acoustic wave filter 21 and the antenna connection terminal 100 and which has a variable inductance value, and the second variable inductor circuit which includes the inductor 42 connected between the ground and the first path connecting the acoustic wave filter 21 to the antenna connection terminal 100 and which has a variable inductance value.

According this, adjustment of the inductance values of the first variable inductor circuit and the second variable inductor circuit enables suppression of deviation of the impedance of the acoustic wave filter 21 from the matching impedance due to a temperature rise. Thus, even when a transmit signal of high output is output from the power amplifier 11, without lowering the temperature to decrease the output power of the transmit signal, the high output may be maintained even at a high temperature.

In addition, for example, in the radio frequency circuit 1, the power amplifier 11 may be compatible with Power Class 2 or a power class whose maximum transmit power is higher than that of Power Class 2.

According to this, even when a transmit signal of high output of Power Class 2 or higher is output from the power amplifier 11, without lowering the temperature to decrease the output power of the transmit signal, the high output may be maintained even at the high temperature.

In addition, for example, in the radio frequency circuit 1, the first variable inductor circuit may have the connection terminals 101 and 102 disposed in series on the first path, the inductor 41, the inductor 43, and the switch 31 which has the common terminal 31*a* and the terminals 31*b* and 31*c*. The switch 31 switches between connection and non-connection between the common terminal 31*a* and the terminal 31*b*, and switches between connection and non-connection between the common terminal 31*a* and the terminal 31*c*. The inductor 41 may be connected between the common terminal 31*a* and one of the connection terminals 101 and 102. The inductor 43 may be connected between the terminal 31*b* and the other one of the connection terminals 101 and 102. The terminal 31*c* may be connected to the other one of the connection terminals 101 and 102.

According to this, switching the connection state of the switch 31 enables adjustment of the inductance value of the first variable inductor circuit. Therefore, deviation of the impedance of the acoustic wave filter 21 from the matching impedance due to a temperature rise may be suppressed.

In addition, for example, in the radio frequency circuit 1, the second variable inductor circuit may have the inductor 42, the inductor 44, and the switch 32 which has the common terminal 32*a* and the terminals 32*b* and 32*c*. The switch 32 switches between connection and non-connection between the common terminal 32*a* and the terminal 32*b*, and switches between connection and non-connection between the common terminal 32*a* and the terminal 32*c*. The inductor 42 may be connected between the common terminal 32*a* and one of the first path and the ground. The inductor 44 may be connected between the terminal 32*c* and the other one of the first path and the ground. The terminal 32*b* may be connected to the other one of the first path and the ground.

According to this, switching the connection state of the switch 32 in conjunction with that of the switch 31 enables adjustment of the inductance value of the second variable inductor circuit. Therefore, deviation of the impedance of the acoustic wave filter 21 from the matching impedance due to a temperature rise may be suppressed.

In addition, for example, in the radio frequency circuit 1, the inductance value of the inductor 41 may be higher than that of the inductor 43 and the inductance value of the inductor 42 may be higher than that of the inductor 44.

According to this, the inductor 41, having a high inductance value, is disposed on the signal path connected to the common terminal 31*a* and the inductor 43, having a low inductance value for fine adjustment, is disposed on the signal path connected to the terminal 31*b*. Thus, the number of inductors, which are to be disposed, may be reduced with respect to the inductance value required for the first variable inductor circuit, achieving a reduction in size of the first variable inductor circuit. In addition, the inductor 42, having a high inductance value, is disposed on the signal path connected to the common terminal 32*a* and the inductor 44, having a low inductance value for fine adjustment, is disposed on the signal path connected to the terminal 32*c*. Thus, the number of inductors, which are to be disposed, may be reduced with respect to the inductance value required for the second variable inductor circuit, achieving a reduction in size of the second variable inductor circuit.

In addition, for example, when the temperature measured by the temperature sensor 61 is higher than the threshold temperature Tt, the radio frequency circuit 1 may be in the following state: the common terminal 31*a* is connected to the terminal 31*b*, the common terminal 31*a* is not connected to the terminal 31*c*, the common terminal 32*a* is not connected to the terminal 32*b*, and the common terminal 32*a* is connected to the terminal 32*c*.

According to this, at a high temperature, the first variable inductor circuit forms a series-connected circuit of the inductors 41 and 43, causing a high series inductance value to be obtained, and the second variable inductor circuit forms a series-connected circuit of the inductors 42 and 44, causing a high shunt inductance value to be obtained.

In addition, for example, when the temperature Tt measured by the temperature sensor 61 is lower than the threshold temperature, the radio frequency circuit 1 may be in the following state: the common terminal 31*a* is connected to the terminal 31*b*, the common terminal 31*a* is connected to the terminal 31*c*, the common terminal 32*a* is connected to the terminal 32*b*, and the common terminal 32*a* is connected to the terminal 32*c*.

According to this, at an ordinary temperature, only the inductor 41 works in the first variable inductor circuit, causing a low series inductance, and only the inductor 42 works in the second variable inductor circuit, causing a low shunt inductance.

In addition, for example, the radio frequency circuit 1 may further include the substrate 90 having the first principal surface and the second principal surface which are opposite each other. The switches 31 and 32 may be included in the PA control circuit 70 disposed on the second principal surface. The inductors 41 and 42 may be chip-like inductors disposed on the first principal surface. The inductors 43 and 44 may be inductors which include coil conductors formed on the substrate 90.

According to this, some circuit devices included in the radio frequency circuit 1 are disposed on the first principal surface of the substrate 90, and some circuit devices are disposed on the second principal surface. In addition, the switches 31 and 32 are included in the PA control circuit 70. This achieves a reduction in size of the radio frequency circuit 1.

In addition, for example, the radio frequency circuit 1A according to the first modified example may further include the substrate 90 having the first principal surface and the second principal surface which are opposite each other. The switches 31 and 32 may be included in the PA control circuit 70A disposed on the second principal surface. The inductors 41 and 42 may be chip-like inductors disposed on the first principal surface. The inductors 43 and 44 may be inductors which include coil conductors formed in the PA control circuit 70A.

According to this, some circuit devices included in the radio frequency circuit 1A are disposed on the first principal surface of the substrate 90, and some circuit devices are disposed on the second principal surface. The switches 31 and 32 and the inductors 43 and 44 are included in the PA control circuit 70A, achieving a reduction in size of the radio frequency circuit 1A.

In addition, for example, in the radio frequency circuits 1 and 1A, in the plan view of the substrate 90, at least part of the inductor 41 may overlap the PA control circuit 70 or 70A and at least part of the inductor 42 may overlap the PA control circuit 70 or 70A.

According to this, the connecting wiring between the inductor 41 and the switch 31 and the connecting wiring between the inductor 42 and the switch 32 may be made short, achieving low loss and a reduction in size of the radio frequency circuits 1 and 1A.

In addition, for example, in the radio frequency circuits 1 and 1A, the PA control circuit 70 or 70A may include the control circuit which controls the first variable inductor circuit and the second variable inductor circuit.

In addition, for example, in the radio frequency circuit 1B according to the second modified example, the first variable inductor circuit may have the connection terminals 101 and 102 which are disposed in series on the first path connecting the acoustic wave filter 21 to the antenna connection terminal 100, the inductor 41, the third inductor and the fourth inductor which are electromagnetically coupled to each other, and the variable capacitor 452. The inductor 41 may be connected between the first end of the third inductor and one of the connection terminals 101 and 102. The second end of the third inductor may be connected to the other one of the connection terminals 101 and 102. The first end of the fourth inductor may be connected to the first end of the variable capacitor 452. The second end of the fourth inductor and the second end of the variable capacitor 452 may be connected to the ground.

According to this, changing the capacitance value of the variable capacitor 452 enables adjustment of the inductance value of the first variable inductor circuit. Therefore, deviation of the impedance of the acoustic wave filter 21 from the matching impedance due to a temperature rise may be suppressed.

According to this, the inductance value of the first variable inductor circuit is adjusted by changing the inductance value of the variable inductor 45. This enables suppression of deviation of the impedance of the acoustic wave filter 21 from the matching impedance due to a temperature rise. Thus, even when a transmit signal of high output is output from the power amplifier 11, without lowering the temperature to decrease the output power of the transmit signal, the high output may be maintained even at a high temperature.

In addition, for example, in the radio frequency circuit 1B according to the second modified example, the second variable inductor circuit may have the inductor 42, the fifth inductor and the sixth inductor which are electromagnetically coupled to each other, and the variable capacitor 462. The inductor 42 may be connected between the first end of the fifth inductor and one of the first path and the ground. The second end of the fifth inductor may be connected to the other one of the first path and the ground. The first end of the sixth inductor may be connected to the first end of the variable capacitor 462. The second end of the sixth inductor and the second end of the variable capacitor 462 may be connected to the ground.

According this, the inductance value of the second variable inductor circuit is adjusted by changing the inductance value of the variable inductor 46. This enables suppression of deviation of the impedance of the acoustic wave filter 21 from the matching impedance due to a temperature rise. Thus, even when a transmit signal of high output is output from the power amplifier 11, without lowering the temperature to decrease the output power of the transmit signal, the high output may be maintained even at a high temperature.

In addition, for example, in the radio frequency circuit 1C according to the third modified example, the acoustic wave filter 21 may be constituted by one or more surface acoustic wave resonators having an IDT electrode. At least one of the variable capacitors 452 and 462 may include the IDT electrode, and the temperature sensor may be the IDT electrode.

According to this, the inductance values of the first variable inductor circuit and the second variable inductor circuit are adjusted by changing the inductance values of the variable inductors 45 and 46. This enables suppression of deviation of the impedance of the acoustic wave filter 21 from the matching impedance due to a temperature rise. Thus, even when a transmit signal of high output is output from the power amplifier 11, without lowering the temperature to decrease the output power of the transmit signal, the high output may be maintained even at the high temperature.

In addition, for example, the radio frequency circuit 1B may further include the substrate 90 having the first principal surface and the second principal surface which are opposite each other. Part of the variable capacitor 452 and part of the variable capacitor 462 may be included in the PA control circuit 70B disposed on the second principal surface. The inductors 41 and 42 may be chip-like inductors disposed on the first principal surface. The third inductor, the fourth inductor, the fifth inductor, and the sixth inductor may be inductors which include coil conductors formed on or in the substrate 90. In the plan view of the substrate 90, the third inductor may overlap the fourth inductor partially and the fifth inductor may overlap the sixth inductor partially.

According to this, the third inductor overlaps the fourth inductor in the plan view of the substrate 90, and the fifth inductor overlaps the sixth inductor in the plan view of the substrate 90, achieving a reduction in size of the transformers 451 and 461 and a reduction in size of the radio frequency circuit 1B.

In addition, for example, the radio frequency circuit 1C may further include the substrate 90 having the first principal surface and the second principal surface which are opposite each other. Part of the variable capacitor 452 and part of the variable capacitor 462 may be included in the acoustic wave filter 21 disposed on the first principal surface. The inductors 41 and 42 may be chip-like inductors disposed on the first principal surface. The third inductor, the fourth inductor, the fifth inductor, and the sixth inductor may be inductors which include coil conductors formed on or in the substrate 90. In the plan view of the substrate 90, the third inductor may overlap the fourth inductor partially, and the fifth inductor may overlap the sixth inductor partially.

According to this, the third inductor overlaps the fourth inductor in the plan view of the substrate 90 and the fifth inductor overlaps the sixth inductor in the plan view of the substrate 90, achieving a reduction in size of the transformers 451 and 461 and a reduction in size of the radio frequency circuit 1C.

In addition, for example, the radio frequency circuit 1D according to the fourth modified example may further include the acoustic wave filter 23, the low-noise amplifier 12 connected to the acoustic wave filter 23, the third variable inductor circuit which includes the inductor 47 disposed between the acoustic wave filter 23 and the antenna connection terminal 100 and which has a variable inductance value, and the PA control circuit 70D which controls the first variable inductor circuit, the second variable inductor circuit, and the third variable inductor circuit. When the temperature measured by the temperature sensor 61 is higher than the threshold temperature Tt, the PA control circuit 70D may make the inductance value of the third variable inductor circuit higher compared with the case in which the temperature measured by the temperature sensor 61 is lower than or equal to the threshold temperature Tt.

In addition, for example, the radio frequency circuit 1D according to the fourth modified example may further include the switch 30 which has the common terminal 30*a* and the terminals 30*b* and 30*c*. The switch 30 switches between connection and non-connection between the common terminal 30*a* and the terminal 30*b*, and switches between connection and non-connection between the common terminal 30*a* and the terminal 30*d*. The common terminal 30*a* may be connected to the antenna connection terminal 100. The first variable inductor circuit may be connected to the terminal 30*b*. The acoustic wave filter 23 may be connected to the terminal 30*d*.

According to this, the transmit path and the receive path are connected to the respective different terminals 30*b* and 30*d*. Thus, both adjustment of the first variable inductor circuit and the second variable inductor circuit on the transmit path and adjustment of the third variable inductor circuit on the receive path may be performed individually without interfering with each other.

In addition, the radio frequency circuit 1 according to the present exemplary embodiment may include the antenna connection terminal 100, the acoustic wave filter 21, the power amplifier 11 connected to the acoustic wave filter 21, the variable matching circuit connected between the acoustic wave filter 21 and the antenna connection terminal 100, and the PA control circuit 70 which controls the inductance of the variable matching circuit. When the temperature of the power amplifier 11 or the acoustic wave filter 21 is higher than the threshold temperature, the PA control circuit 70 may make the inductance value of the variable matching circuit higher compared with the case in which the temperature is lower than or equal to the threshold temperature.

According to this, the inductance value of the variable matching circuit is made high at a high temperature, achieving suppression of deviation of the impedance of the acoustic wave filter 21 from the matching impedance due to a temperature rise. Thus, even when a transmit signal of high output is output from the power amplifier 11, without lowering the temperature to decrease the output power of the transmit signal, the high output may be maintained even at the high temperature.

In addition, for example, in the radio frequency circuit 1, the variable matching circuit may include the first variable inductor circuit disposed in series between the acoustic wave filter 21 and the antenna connection terminal 100, and the second variable inductor circuit connected between the ground and the first path connecting the acoustic wave filter 21 to the antenna connection terminal 100. When the temperature of the power amplifier 11 or the acoustic wave filter 21 is higher than the threshold temperature, the PA control circuit 70 may make the inductance value of the first variable inductor circuit higher and may make the inductance value of the second variable inductor circuit higher compared with the case in which the temperature is lower than or equal to the threshold temperature.

According to this, the series inductance value and the shunt inductance value of the variable matching circuit are made high at a high temperature, achieving suppression of deviation of the impedance of the acoustic wave filter 21 from the matching impedance due to a temperature rise.

OTHER EMBODIMENTS AND THE LIKE

The radio frequency circuit according to the exemplary embodiment of the present disclosure is described above by describing the exemplary embodiment and the modified examples. The radio frequency circuit provided by the present disclosure is not limited to the exemplary embodiment and the modified examples. Different embodiments, which are implemented by combining any component in the exemplary embodiment and the modified examples, modified examples, which are obtained by making various modifications, which are conceived by those skilled in the art without departing from the gist of the present disclosure, on the exemplary embodiment and the modified examples, and various devices including the radio frequency circuit are also encompassed in the present disclosure.

For example, in the radio frequency circuit according to the exemplary embodiment and the modified examples, a different circuit device, wiring, and the like may be inserted between paths, which connect the circuit devices and the signal paths which are disclosed in the drawings.

Features of the radio frequency circuit described on the basis of the exemplary embodiments will be described below.

<1> A radio frequency circuit comprising:

an antenna connection terminal;

a first acoustic wave filter;

a power amplifier connected to the first acoustic wave filter;

a temperature sensor that measures a temperature of either one or both of the first acoustic wave filter and the power amplifier;

a first variable inductor circuit that includes a first inductor disposed in series between the first acoustic wave filter and the antenna connection terminal, and that has a variable inductance value; and a second variable inductor circuit that includes a second inductor connected between a ground and a first path connecting the first acoustic wave filter to the antenna connection terminal, and that has a variable inductance value.

<2> The radio frequency circuit according to <1>, wherein the power amplifier is compatible with Power Class 2 and a power class whose maximum transmit power is higher than Power Class 2.

<3> The radio frequency circuit according to <1> or <2>, wherein the first variable inductor circuit has a first connection terminal and a second connection terminal that are disposed in series to the first path, the first inductor, a third inductor, and a first switch that has a first common terminal, a first terminal, and a second terminal, the first switch switching between connection and non-connection between the first common terminal and the first terminal, the first switch switching between connection and non-connection between the first common terminal and the second terminal, wherein the first inductor is connected between the first common terminal and one of the first connection terminal and the second connection terminal, wherein the third inductor is connected between the first terminal and the other one of the first connection terminal and the second connection terminal, and wherein the second terminal is connected to the other one of the first connection terminal and the second connection terminal.

<4> The radio frequency circuit according to <3>, wherein the second variable inductor circuit has the second inductor, a fourth inductor, and a second switch that has a second common terminal, a third terminal, and a fourth terminal, the second switch switching between connection and non-connection between the second common terminal and the third terminal, the second switch switching between connection and non-connection between the second common terminal and the fourth terminal, wherein the second inductor is connected between the second common terminal and one of the first path and the ground, wherein the fourth inductor is connected between the fourth terminal and the other one of the first path and the ground, and wherein the third terminal is connected to the other one of the first path and the ground.

<5> The radio frequency circuit according to <4>, wherein an inductance value of the first inductor is higher than an inductance value of the third inductor, and wherein an inductance value of the second inductor is higher than an inductance value of the fourth inductor.

<6> The radio frequency circuit according to <4> or <5>, wherein, when the temperature measured by the temperature sensor is higher than a threshold temperature, the first common terminal is connected to the first terminal; the first common terminal is not connected to the second terminal; the second common terminal is not connected to the third terminal; and the second common terminal is connected to the fourth terminal.

<7> The radio frequency circuit according to <4> or <5>, wherein, when the temperature measured by the temperature sensor is lower than or equal to a threshold temperature, the first common terminal is connected to the first terminal; the first common terminal is connected to the second terminal; the second common terminal is connected to the third terminal; and the second common terminal is connected to the fourth terminal.

<8> The radio frequency circuit according to any one of <4> to <7>, further comprising:

a substrate having a first principal surface and a second principal surface which are opposite each other, wherein the first switch and the second switch are included in a first semiconductor IC disposed on the second principal surface, wherein the first inductor and the second inductor are chip-like inductors disposed on the first principal surface, and wherein the third inductor and the fourth inductor are inductors including coil conductors formed on the substrate.

<9> The radio frequency circuit according to any one of <4> to <7>, further comprising:

a substrate having a first principal surface and a second principal surface which are opposite each other, wherein the first switch and the second switch are included in a first semiconductor IC disposed on the second principal surface, wherein the first inductor and the second inductor are chip-like inductors disposed on the first principal surface, and wherein the third inductor and the fourth inductor are inductors including coil conductors formed in the first semiconductor IC.

<10> The radio frequency circuit according to <8> or <9>, wherein, in plan view of the substrate, at least part of the first inductor overlaps the first semiconductor IC, and at least part of the second inductor overlaps the first semiconductor IC.

<11> The radio frequency circuit according to any one of <8> to <10>, wherein the first semiconductor IC includes a control circuit that controls the first variable inductor circuit and the second variable inductor circuit.

<12> The radio frequency circuit according to <1> or <2>, wherein the first variable inductor circuit has a first connection terminal and a second connection terminal that are disposed in series to the first path connecting the first acoustic wave filter to the antenna connection terminal, the first inductor, a third inductor and a fourth inductor that are electromagnetically coupled to each other, and a first variable capacitor, wherein the first inductor is connected between a first end of the third inductor and one of the first connection terminal and the second connection terminal, wherein a second end of the third inductor is connected to the other one of the first connection terminal and the second connection terminal, wherein a first end of the fourth inductor is connected to a first end of the first variable capacitor, and wherein a second end of the fourth inductor and a second end of the first variable capacitor are connected to the ground.

<13> (The radio frequency circuit according to <12>, wherein the second variable inductor circuit has the second inductor, a fifth inductor and a sixth inductor that are electromagnetically coupled to each other, and a second variable capacitor, wherein the second inductor is connected between a first end of the fifth inductor and one of the first path and the ground, wherein a second end of the fifth inductor is connected to the other one of the first path and the ground, wherein a first end of the sixth inductor is connected to a first end of the second variable capacitor, and wherein a second end of the sixth inductor and a second end of the second variable capacitor are connected to the ground.

<14> The radio frequency circuit according to <13>, wherein the first acoustic wave filter includes one or more surface acoustic wave resonators having an IDT (Inter-Digital Transducer) electrode, wherein either one or both of the first variable capacitor and the second variable capacitor include the IDT electrode, and wherein the temperature sensor is the IDT electrode.

<15> The radio frequency circuit according to <13>, further comprising:

a substrate having a first principal surface and a second principal surface that are opposite each other, wherein part of the first variable capacitor and part of the second variable capacitor are included in a second semiconductor IC disposed on the second principal surface, wherein the first inductor and the second inductor are chip-like inductors disposed on the first principal surface, wherein the third inductor, the fourth inductor, the fifth inductor, and the sixth inductor are inductors including coil conductors formed on or in the substrate, and wherein, in plan view of the substrate, the third inductor overlaps the fourth inductor at least partially, and the fifth inductor overlaps the sixth inductor at least partially.

<16> The radio frequency circuit according to <14>, further comprising:

a substrate having a first principal surface and a second principal surface that are opposite each other, wherein part of the first variable capacitor and part of the second variable capacitor are included in the first acoustic wave filter disposed on the first principal surface, wherein the first inductor and the second inductor are chip-like inductors disposed on the first principal surface, wherein the third inductor, the fourth inductor, the fifth inductor, and the sixth inductor are inductors including coil conductors formed on or in the substrate, and wherein, in plan view of the substrate, the third inductor overlaps the fourth inductor at least partially, and the fifth inductor overlaps the sixth inductor at least partially.

<17> The radio frequency circuit according to any one of <1> to <16>, further comprising:

a second acoustic wave filter;

a low-noise amplifier connected to the second acoustic wave filter;

a third variable inductor circuit that includes a seventh inductor disposed between the second acoustic wave filter and the antenna connection terminal, and that has a variable inductance value; and a control circuit that controls the first variable inductor circuit, the second variable inductor circuit, and the third variable inductor circuit, wherein, when the temperature measured by the temperature sensor is higher than a threshold temperature, the control circuit makes the inductance value of the third variable inductor circuit higher compared with the case in which the temperature measured by the temperature sensor is lower than or equal to the threshold temperature.

<18> The radio frequency circuit according to any one of <1> to <16>, further comprising:

a second acoustic wave filter;

a low-noise amplifier connected to the second acoustic wave filter; and a third switch that has a third common terminal, a fifth terminal, and a sixth terminal, the third switch switching between connection and non-connection between the third common terminal and the fifth terminal, the third switch switching between connection and non-connection between the third common terminal and the sixth terminal, wherein the third common terminal is connected to the antenna connection terminal, wherein the first variable inductor circuit is connected to the fifth terminal, and wherein the second acoustic wave filter is connected to the sixth terminal.

<19> A radio frequency circuit comprising:

an antenna connection terminal;

a first acoustic wave filter;

a power amplifier connected to the first acoustic wave filter;

a variable matching circuit connected between the first acoustic wave filter and the antenna connection terminal; and a control circuit that controls an inductance of the variable matching circuit, wherein, when a temperature of the power amplifier or the first acoustic wave filter is higher than a threshold temperature, the control circuit makes the inductance value of the variable matching circuit higher compared with the case in which the temperature is lower than or equal to the threshold temperature.

<20> The radio frequency circuit according to <19>, wherein the variable matching circuit includes a first variable inductor circuit disposed in series between the first acoustic wave filter and the antenna connection terminal, and a second variable inductor circuit connected between a ground and a first path connecting the first acoustic wave filter to the antenna connection terminal, and wherein, when the temperature of the power amplifier or the first acoustic wave filter is higher than the threshold temperature, the control circuit makes an inductance value of the first variable inductor circuit higher and makes an inductance value of the second variable inductor circuit higher compared with the case in which the temperature is lower than or equal to the threshold temperature.

INDUSTRIAL APPLICABILITY

The present disclosure may be applied, as a radio frequency circuit disposed in a frontend unit compatible with multi-bands, widely to communication devices such as a cellular phone.

REFERENCE SIGNS LIST

1, 1A, 1B, 1C, 1D radio frequency circuit
2 antenna
3 RF-signal processing circuit (RFIC)
4, 4D communication device
11 power amplifier
12 low-noise amplifier
21, 23 acoustic wave filter
24 multiplexer
30, 31, 32, 33 switch
30*a*, 31*a*, 32*a*, 33*a* common terminal
30*b*, 30*c*, 30*d*, 31*b*, 31*c*, 32*b*, 32*c*, 33*b*, 33*c* terminal

41, 42, 43, 44, 47, 48, 49, 451*a*, 451*b*, 461*a*, 461*b* inductor
45, 46 variable inductor
51 capacitor
61 temperature sensor
70, 70A, 70B, 70C, 70D PA control circuit
80, 81, 82, 83 semiconductor IC
90 substrate
100 antenna connection terminal
101, 102 connection terminal
110 transmission input terminal
120 reception output terminal
451, 461 transformer
452, 462 variable capacitor

The invention claimed is:

1. A radio frequency circuit comprising:
an antenna connection terminal;
a first acoustic wave filter;
a power amplifier connected to the first acoustic wave filter;
a temperature sensor that measures a temperature of either one or both of the first acoustic wave filter and the power amplifier;
a first variable inductor circuit that includes a first inductor disposed in series between the first acoustic wave filter and the antenna connection terminal, and that has a variable inductance value; and
a second variable inductor circuit that includes a second inductor connected between a ground and a first path connecting the first acoustic wave filter to the antenna connection terminal, and that has a variable inductance value.

2. The radio frequency circuit according to claim 1,
wherein the power amplifier is compatible with Power Class 2 and a power class whose maximum transmit power is higher than Power Class 2.

3. The radio frequency circuit according to claim 1,
wherein the first variable inductor circuit has
a first connection terminal and a second connection terminal that are disposed in series to the first path,
the first inductor,
a third inductor, and
a first switch that has a first common terminal, a first terminal, and a second terminal, the first switch switching between connection and non-connection between the first common terminal and the first terminal, and the first switch switching between connection and non-connection between the first common terminal and the second terminal,
wherein the first inductor is connected between the first common terminal and one of the first connection terminal and the second connection terminal,
wherein the third inductor is connected between the first terminal and the other one of the first connection terminal and the second connection terminal, and
wherein the second terminal is connected to the other one of the first connection terminal and the second connection terminal.

4. The radio frequency circuit according to claim 3,
wherein the second variable inductor circuit has
the second inductor,
a fourth inductor, and
a second switch that has a second common terminal, a third terminal, and a fourth terminal, the second switch switching between connection and non-connection between the second common terminal and the third terminal, and the second switch switching between connection and non-connection between the second common terminal and the fourth terminal,
wherein the second inductor is connected between the second common terminal and one of the first path and the ground,
wherein the fourth inductor is connected between the fourth terminal and the other one of the first path and the ground, and
wherein the third terminal is connected to the other one of the first path and the ground.

5. The radio frequency circuit according to claim 4,
wherein an inductance value of the first inductor is higher than an inductance value of the third inductor, and
wherein an inductance value of the second inductor is higher than an inductance value of the fourth inductor.

6. The radio frequency circuit according to claim 4, further comprising:
a substrate having a first principal surface and a second principal surface which are opposite to each other,
wherein the first switch and the second switch are included in a first semiconductor IC disposed on the second principal surface,
wherein the first inductor and the second inductor are chip-like inductors disposed on the first principal surface, and
wherein the third inductor and the fourth inductor are inductors including coil conductors formed on the substrate.

7. The radio frequency circuit according to claim 6,
wherein, in a plan view of the substrate,
at least part of the first inductor overlaps the first semiconductor IC, and
at least part of the second inductor overlaps the first semiconductor IC.

8. The radio frequency circuit according to claim 6,
wherein the first semiconductor IC includes a control circuit configured to control the first variable inductor circuit and the second variable inductor circuit.

9. The radio frequency circuit according to claim 4, further comprising:
a substrate having a first principal surface and a second principal surface which are opposite each other,
wherein the first switch and the second switch are included in a first semiconductor IC disposed on the second principal surface,
wherein the first inductor and the second inductor are chip-like inductors disposed on the first principal surface, and
wherein the third inductor and the fourth inductor are inductors including coil conductors formed in the first semiconductor IC.

10. The radio frequency circuit according to claim 1, further comprising:
a second acoustic wave filter;
a low-noise amplifier connected to the second acoustic wave filter; and
a third switch that has a third common terminal, a fifth terminal, and a sixth terminal, the third switch switching between connection and non-connection between the third common terminal and the fifth terminal, and the third switch switching between connection and non-connection between the third common terminal and the sixth terminal,
wherein the third common terminal is connected to the antenna connection terminal,
wherein the first variable inductor circuit is connected to the fifth terminal, and wherein the second acoustic wave filter is connected to the sixth terminal.

11. The radio frequency circuit according to claim 1, wherein the first variable inductor circuit has a first connection terminal and a second connection terminal that are disposed in series to the first path connecting the first acoustic wave filter to the antenna connection terminal, the first inductor, a third inductor and a fourth inductor that are electromagnetically coupled to each other, and a first variable capacitor, wherein the first inductor is connected between a first end of the third inductor and one of the first connection terminal and the second connection terminal, wherein a second end of the third inductor is connected to the other one of the first connection terminal and the second connection terminal, wherein a first end of the fourth inductor is connected to a first end of the first variable capacitor, and wherein a second end of the fourth inductor and a second end of the first variable capacitor are connected to the ground.

12. The radio frequency circuit according to claim 11, wherein the second variable inductor circuit has the second inductor, a fifth inductor and a sixth inductor that are electromagnetically coupled to each other, and a second variable capacitor, wherein the second inductor is connected between a first end of the fifth inductor and one of the first path and the ground, wherein a second end of the fifth inductor is connected to the other one of the first path and the ground, wherein a first end of the sixth inductor is connected to a first end of the second variable capacitor, and wherein a second end of the sixth inductor and a second end of the second variable capacitor are connected to the ground.

13. The radio frequency circuit according to claim 12, wherein the first acoustic wave filter includes one or more surface acoustic wave resonators having an IDT (Inter-Digital Transducer) electrode, wherein either one or both of the first variable capacitor and the second variable capacitor include the IDT electrode, and wherein the temperature sensor is the IDT electrode.

14. The radio frequency circuit according to claim 13, further comprising:

a substrate having a first principal surface and a second principal surface that are opposite each other, wherein part of the first variable capacitor and part of the second variable capacitor are included in the first acoustic wave filter disposed on the first principal surface, wherein the first inductor and the second inductor are chip-like inductors disposed on the first principal surface, wherein the third inductor, the fourth inductor, the fifth inductor, and the sixth inductor are inductors including coil conductors formed on or in the substrate, and wherein, in a plan view of the substrate, the third inductor overlaps the fourth inductor at least partially, and the fifth inductor overlaps the sixth inductor at least partially.

15. The radio frequency circuit according to claim 12, further comprising:

a substrate having a first principal surface and a second principal surface that are opposite each other, wherein part of the first variable capacitor and part of the second variable capacitor are included in a second semiconductor IC disposed on the second principal surface, wherein the first inductor and the second inductor are chip-like inductors disposed on the first principal surface, wherein the third inductor, the fourth inductor, the fifth inductor, and the sixth inductor are inductors including coil conductors formed on or in the substrate, and wherein, in a plan view of the substrate, the third inductor overlaps the fourth inductor at least partially, and the fifth inductor overlaps the sixth inductor at least partially.

16. The radio frequency circuit according to claim 11, further comprising:

a second acoustic wave filter;

a low-noise amplifier connected to the second acoustic wave filter;

a third variable inductor circuit that includes a seventh inductor disposed between the second acoustic wave filter and the antenna connection terminal, and that has a variable inductance value; and a control circuit that controls the first variable inductor circuit, the second variable inductor circuit, and the third variable inductor circuit, wherein, when the temperature measured by the temperature sensor is higher than a threshold temperature, the control circuit makes the inductance value of the third variable inductor circuit higher compared with the case in which the temperature measured by the temperature sensor is lower than or equal to the threshold temperature.

17. A method comprising:

measuring a temperature of either one or both of a first acoustic wave filter and a power amplifier;

detecting the temperature being higher than a threshold temperature; and in response to detecting that the temperature is higher than the threshold temperature:

increasing an inductance value of a first variable inductor circuit, the first variable inductor circuit being connected to the first acoustic wave filter and the power amplifier, and increasing an inductance value of a second variable inductor circuit, the second variable inductor circuit being placed between a ground and a first path connecting the first acoustic wave filter to an antenna connection terminal.

18. The method according to claim 17, wherein increasing the inductance value of the first variable inductor circuit includes switching a first switch to connect a first common terminal and a first terminal and to disconnect the first common terminal and a second terminal, the first common terminal being connected to the first acoustic wave filter and the power amplifier, and the first terminal being connected to a first inductor; and increasing the inductance value of the second variable inductor circuit includes switching a second switch to disconnect a second common terminal and a third terminal and to connect the second common terminal and a fourth terminal, the second common terminal being connected to a second inductor connected to the first path, the third terminal being connected to a ground, and the fourth terminal being connected to a fourth inductor.

19. The method according to claim 17, wherein increasing the inductance value of the first variable inductor circuit includes changing a capacitance of a first variable capacitor, the first variable capacitor being connected to a first inductor and ground; and increasing the inductance value of the second variable inductor circuit includes changing a capacitance of a second variable capacitor, the second variable capacitor being connected to a second inductor and ground.

20. A radio frequency circuit comprising:

an antenna connection terminal;

a first acoustic wave filter;

a power amplifier connected to the first acoustic wave filter;

a first variable inductor circuit that includes a first inductor disposed in series between the first acoustic wave filter and the antenna connection terminal, and that has a variable inductance value; and a second variable inductor circuit that includes a second inductor connected between a ground and a first path connecting the first acoustic wave filter to the antenna connection terminal, and that has a variable inductance value, wherein the first variable inductor circuit has a first variable capacitor, wherein the second variable inductor circuit has a second variable capacitor, wherein the first acoustic wave filter includes one or more surface acoustic wave resonators having an IDT (Inter-Digital Transducer) electrode, and wherein either one or both of the first variable capacitor and the second variable capacitor include the IDT electrode.

* * * * *